US011521898B2

(12) United States Patent
Hung

(10) Patent No.: US 11,521,898 B2
(45) Date of Patent: Dec. 6, 2022

(54) THREE-DIMENSIONAL NAND FLASH MEMORY DEVICE AND METHOD OF FABRICATING THE SAME

(71) Applicant: MACRONIX International Co., Ltd., Hsinchu (TW)

(72) Inventor: Min-Feng Hung, Hsing-Chu (TW)

(73) Assignee: MACRONIX INIERNATIONAL CO., LTD., Hsinchu (TW)

( * ) Notice: Subject to any disclaimer, the term of this patent is extended or adjusted under 35 U.S.C. 154(b) by 82 days.

(21) Appl. No.: 17/096,539

(22) Filed: Nov. 12, 2020

(65) Prior Publication Data

US 2022/0148919 A1 May 12, 2022

(51) Int. Cl.

| | |
|---|---|
| ***H01L 21/768*** | (2006.01) |
| ***H01L 27/11582*** | (2017.01) |
| ***H01L 23/528*** | (2006.01) |
| ***H01L 23/00*** | (2006.01) |
| ***H01L 23/522*** | (2006.01) |
| ***H01L 21/311*** | (2006.01) |
| ***H01L 21/3213*** | (2006.01) |
| ***H01L 27/11565*** | (2017.01) |

(52) U.S. Cl.

CPC .. *H01L 21/76892* (2013.01); *H01L 21/76805* (2013.01); *H01L 23/5283* (2013.01); *H01L 23/562* (2013.01); *H01L 27/11582* (2013.01); *H01L 21/31111* (2013.01); *H01L 21/32134* (2013.01); *H01L 23/5226* (2013.01); *H01L 27/11565* (2013.01)

(58) Field of Classification Search

CPC ......... H01L 21/76892; H01L 21/76805; H01L 23/5283; H01L 23/562; H01L 27/11582; H01L 21/31111; H01L 21/32134; H01L 23/5226; H01L 27/11565; H01L 27/11573; H01L 27/11575

See application file for complete search history.

(56) References Cited

U.S. PATENT DOCUMENTS

2014/0191389 A1* 7/2014 Lee .................. H01L 21/31111 257/734
2015/0179564 A1* 6/2015 Lee .................. H01L 27/11548 257/773

(Continued)

OTHER PUBLICATIONS

"Office Action of Taiwan Counterpart Application", dated Apr. 30, 2021, p. 1-p. 7.

*Primary Examiner* — Shahed Ahmed
*Assistant Examiner* — Vicki B. Booker
(74) *Attorney, Agent, or Firm* — J.C. Patents

(57) ABSTRACT

A memory device is provided. The memory device includes a substrate, a stacked structure, and a contact. The substrate includes a memory array region and a staircase region. The stacked structure is located on the substrate in the memory array region and the staircase region. The stacked structure includes a plurality of conductive layers and a plurality of insulating layers alternately stacked on each other. Each of the plurality of conductive layers includes a main body and an end part. The main body is located in the memory array region and extends to the staircase region. The end part is connected to the main body and is located in the staircase region. A thickness of the end part is greater than a thickness of the main body. The contact lands on and is connected to the end part.

16 Claims, 28 Drawing Sheets

(56) References Cited

U.S. PATENT DOCUMENTS

2015/0287710 A1* 10/2015 Yun .................... H01L 27/1157
257/314
2016/0204102 A1 7/2016 Chen
2017/0271256 A1* 9/2017 Inatsu ............... H01L 23/53271
2019/0006385 A1* 1/2019 Kim .................... H01L 21/7685
2019/0287903 A1 9/2019 Yoshinaga et al.
2019/0296117 A1 9/2019 Ishiduki et al.
2020/0043943 A1* 2/2020 Kang ................ H01L 21/76843

* cited by examiner

THREE-DIMENSIONAL NAND FLASH MEMORY DEVICE AND METHOD OF FABRICATING THE SAME

BACKGROUND

Technical Field

The embodiment of the disclosure relates to a semiconductor device and a fabrication method thereof, and particularly, to a memory device and a fabrication method thereof.

Description of Related Art

Since a non-volatile memory device (e.g., a flash memory) has the advantage that stored data does not disappear at power-off, it becomes a widely used memory device for a personal computer or other electronics equipment.

Currently, the flash memory array commonly used in the industry includes a NOR flash memory and a NAND flash memory. Since the NAND flash memory has a structure in which memory cells are connected together in series, degree of integration and area utilization thereof are better than those of the NOR flash memory. Thus, the NAND flash memory has been widely used in a variety of electronic products. Besides, to further enhance the degree of integration of the memory device, a three-dimensional NAND flash memory is developed. However, there are still some challenges associated with the three-dimensional NAND flash memory.

SUMMARY

An embodiment of the disclosure provides a memory device including a substrate, a stacked structure, a dielectric layer, and a first contact. The substrate includes a memory array region and a staircase region. The stacked structure is located on the substrate in the memory array region and the staircase region. The stacked structure includes a plurality of conductive layers and a plurality of insulating layers stacked alternately on each other. Each of the plurality of conductive layers includes a main body and an end part. The main body is located in the memory array region and extends to the staircase region. The end part is connected to the main body and located in the staircase region. A thickness of the end part is greater than a thickness of the main body. The dielectric layer is located on the stacked structure in the memory array region and the staircase region. The first contact penetrates the dielectric layer in the staircase region and the corresponding insulating layer located on the end part, and lands on and is connected to the end part.

An embodiment of the disclosure provides a method of fabricating a memory device including the following steps. A substrate including a memory array region and a staircase region is provided. A stacked structure is formed on the substrate in the memory array region and the staircase region.

The stacked structure includes a plurality of first material layers and a plurality of second material layers stacked alternately on each other. The stacked structure is patterned to form a staircase structure in the stacked structure in the staircase region. Part of the plurality of second material layers at an end of the staircase structure is removed to form a plurality of first horizontal openings. Part of the plurality of first material layers around the plurality of first horizontal openings is removed to increase a height of the plurality of first horizontal openings. An end part is formed in each of the plurality of first horizontal openings. A material of the end part is the same as a material of the plurality of second material layers, and a thickness of the end part is greater than a thickness of the adjacent second material layer. A dielectric layer is formed on the stacked structure in the memory array region and the staircase region. A first contact is formed in the staircase region. The first contact penetrates the dielectric layer in the staircase region and the corresponding first material layer located on the end part, and lands on and is connected to the end part.

Based on the above, in the embodiments of the disclosure, the thickness of the end part of the gate is locally increased, which may prevent the gate layer under the contact opening having a smaller depth from being etched through in the process of forming contact openings having greater depths. The process of forming the end part may be integrated with the existing processes. In addition, the support pillar structure may be formed in the stacked structure in the staircase region first before the end part is formed to prevent collapse of the stacked structure in the etching process for forming the end part.

To make the aforementioned more comprehensible, several embodiments accompanied with drawings are described in detail as follows.

DESCRIPTION OF THE EMBODIMENTS

Figure 5A:
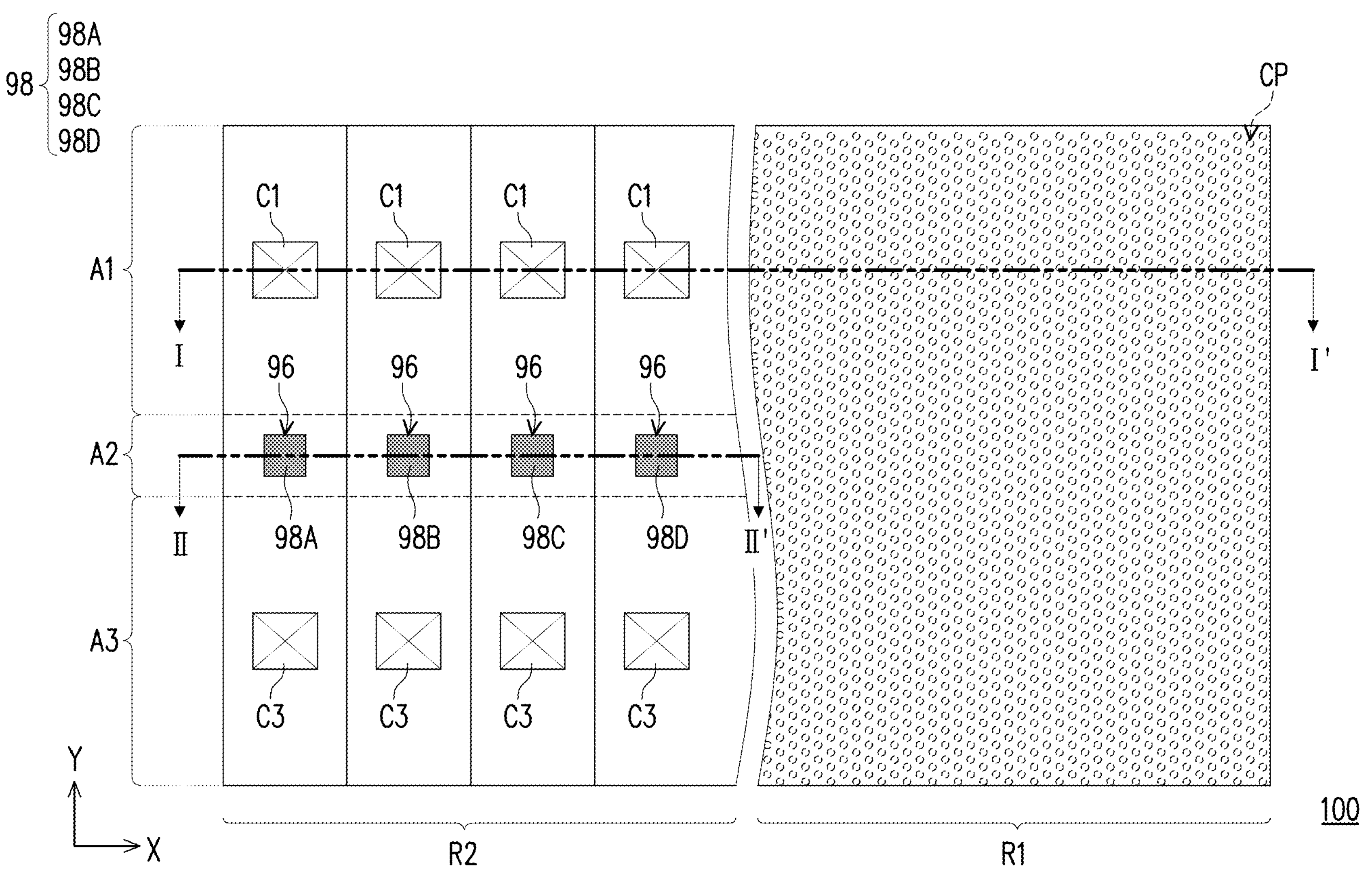
FIG. 5A to FIG. 5C are top views of an intermediate stage of a three-dimensional memory device according to an embodiment of the disclosure.
Figure 5B:
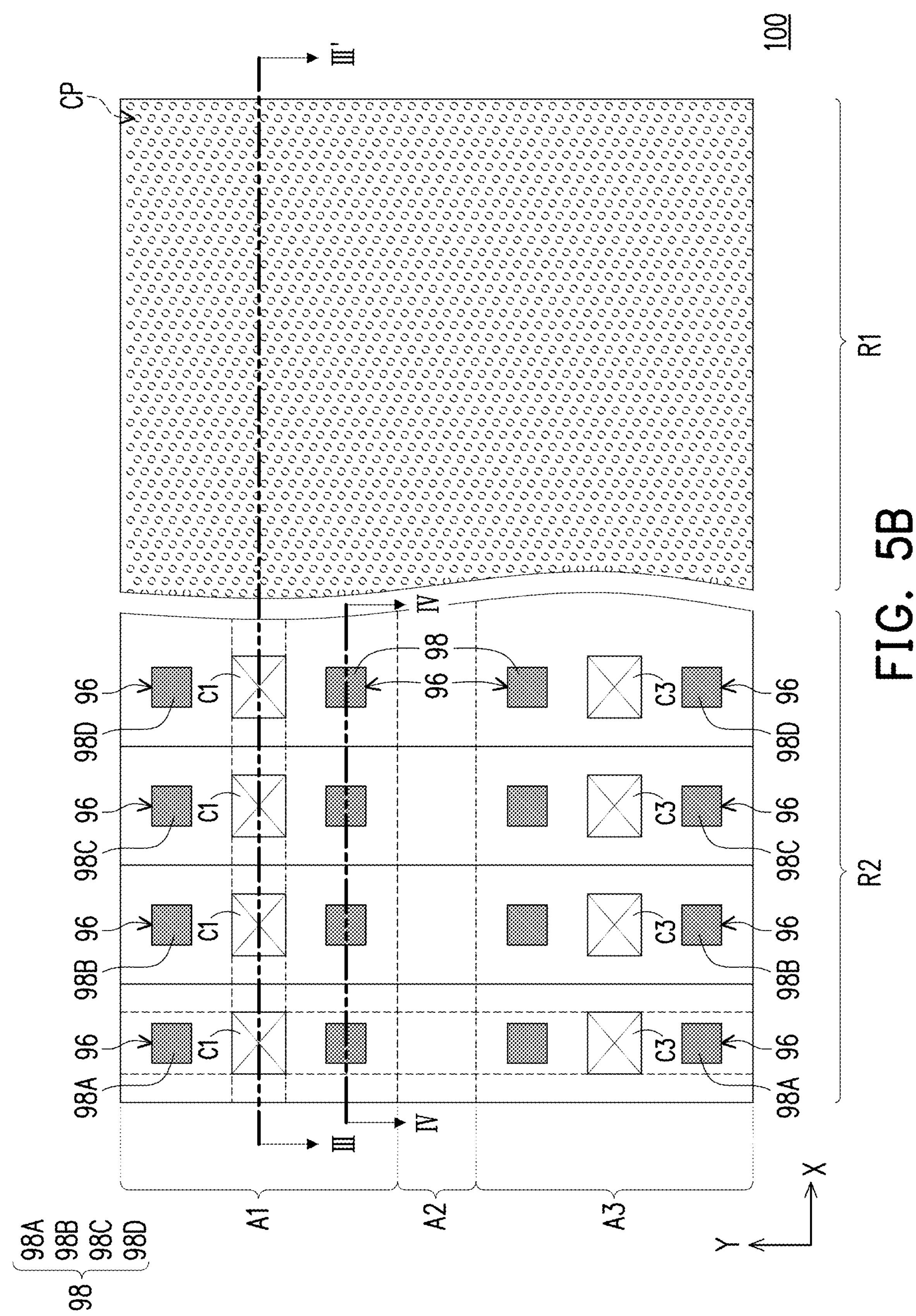

FIG. 1A to FIG. 1I are schematic cross-sectional views of a method of fabricating a three-dimensional memory device according to an embodiment of the disclosure. FIG. 2A to FIG. 2I are other schematic cross-sectional views of a method of fabricating a three-dimensional memory device according to an embodiment of the disclosure. Cross-sectional views of part of the fabrication process along line I-I' of FIG. 5A are as shown in FIG. 1A to FIG. 1I. Cross-sectional views of part of the fabrication process along line II-II' of FIG. 5A are as shown in FIG. 2A to FIG. 2I. Cross-sectional views of part of the fabrication process along line III-III' of FIG. 5B are as shown in FIG. 1A to FIG. 1I. Cross-sectional views of part of the fabrication process along line IV-IV' of FIG. 5A are as shown in FIG. 2A to FIG. 2I.

Figure 1A:
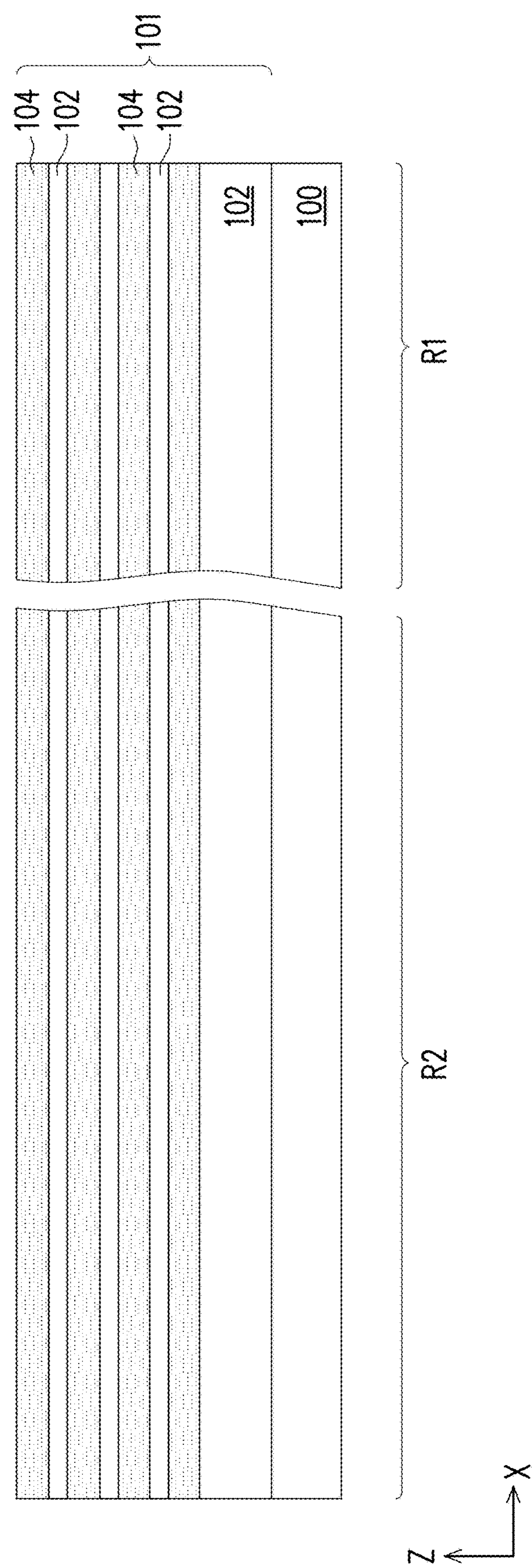
FIG. 1A to FIG. 1I are schematic cross-sectional views of a method of fabricating a three-dimensional memory device according to an embodiment of the disclosure.
Figure 2A:
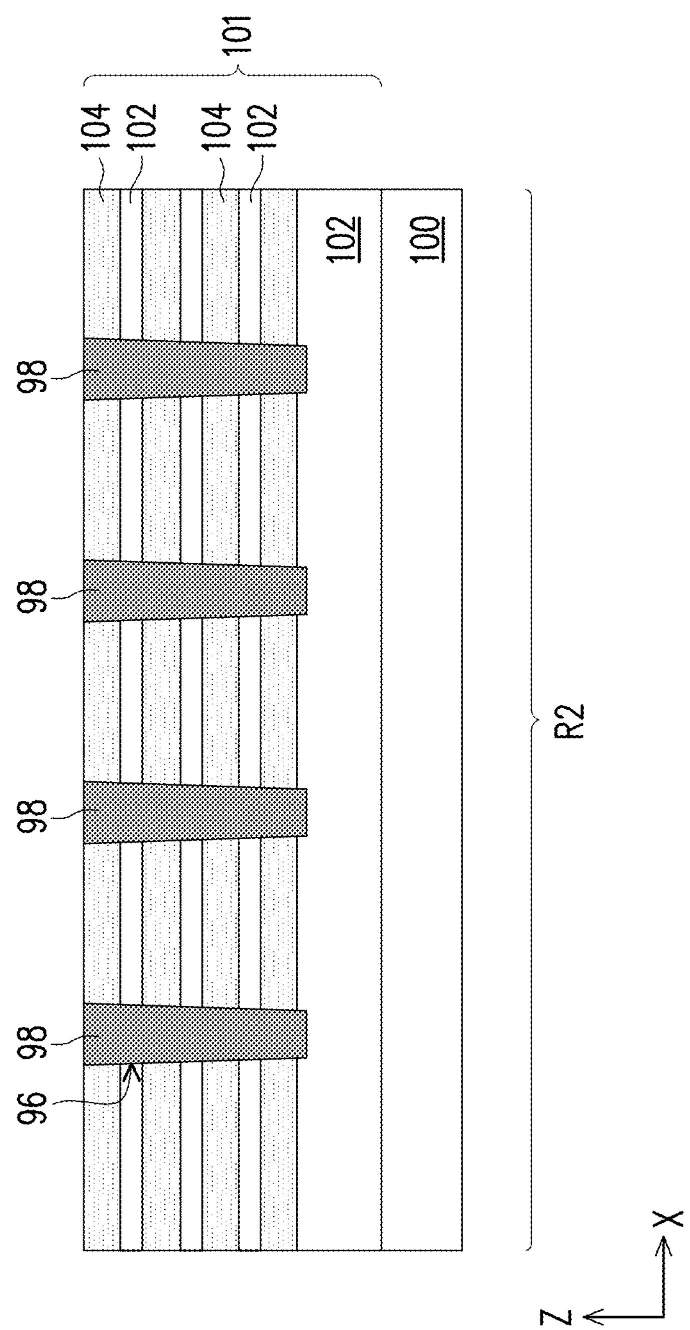
FIG. 2A to FIG. 2I are other schematic cross-sectional views of a method of fabricating a three-dimensional memory device according to an embodiment of the disclosure.

Referring to FIG. 1A and FIG. 2A, a substrate 100 is provided. The substrate 100 may be a semiconductor substrate, such as a silicon-containing substrate. In an embodiment, according to the design requirements, a doped region may be formed in the substrate 100. In an embodiment, the substrate 100 has a memory array region R1 and a staircase region R2. The staircase region R2 includes a zone A1, a zone A2, and a zone A3 (as shown in FIG. 5A). A device layer (not shown) and a metal interconnect structure (not shown) may be formed on the substrate 100. The device layer may include an active device or a passive device. The active device is, for example, a transistor, a diode, etc. The passive device is, for example, a capacitor, an inductor, etc. The metal interconnect structure may include a dielectric layer, a plug, a wire, etc.

Referring to FIG. 1A and FIG. 2A, a stacked structure 101 is formed on the substrate 100. The substrate 100 may be a semiconductor substrate, such as a silicon substrate. The stacked structure 101 is located on the memory array region R1 and the staircase region R2. The stacked structure 101 includes a plurality of first material layers 102 and a plurality of second material layers 104 alternately stacked on each other. The first material layer 102 may be an insulating layer, such as silicon oxide. The second material layer 104 may be an insulating layer (e.g., silicon nitride) or a conductive layer (e.g., doped polysilicon). In an embodiment, the material of the first material layer 102 includes silicon oxide, and the material of the second material layer 104 includes silicon nitride. In another embodiment, the material of the first material layer 102 includes silicon oxide, and the material of the second material layer 104 includes doped polysilicon. In this embodiment, the lowermost layer of the stacked structure 101 is the first material layer 102, and the uppermost layer of the stacked structure 101 is the second material layer 104, but the disclosure is not limited thereto. In addition, in this embodiment, four layers of the second material layer 104 and four layers of the first material layer 102 will be described as an example, but the disclosure is not limited thereto.

Next, referring to FIG. 2A, support structures 98 are formed in the stacked structure 101 in the staircase region R2. The support structures 98 may also be referred to as dummy structures. In some embodiments, the method for forming the support structure 98 is as follows. An opening 96 is formed in the stacked structure 101. In an embodiment, the opening 96 may have a substantially vertical sidewall, as shown in FIG. 2A. In another embodiment, the opening 96 may have a slightly inclined sidewall. Afterwards, an insulating layer (not shown) is formed on the stacked structure 101 and in the opening 96. The material of the insulating layer is different from that of the second material layer 104 and may be, for example, silicon oxide. Then, a planarization process, such as a chemical-mechanical polishing process or an etch-back process, is performed to remove the insulating layer outside the opening 96 to form the support structure 98 in the opening 96. The support structure 98 may prevent collapse of the stacked structure 101 in subsequent fabrication processes. The support structure 98 may have various configurations, such as a pillar, a fence, or a wall. The support structure 98 may be formed only in the staircase region R2, or may be formed in both the staircase region R2 and the memory array region R1.

The shape and position of the support structure 98 will be described in detail below with reference to FIG. 5A to FIG. 5D.

Referring to FIG. 5A and FIG. 5B, the opening 96 may be a hole located in the stacked structure 101 in the staircase region R2. The support structure 98 formed in the hole may be a support pillar. The support structure (support pillar) 98 is located aside a contact to be subsequently formed. In some embodiments, referring to FIG. 5A, the support structure (support pillar) 98 may be multiple and may be arranged in a row, disposed in the zone A2 between the zones A1 and A3, and located between contacts C1 and C3 in the zones A1 and A3. In other embodiments, referring to FIG. 5B, the support structure (support pillar) 98 may be multiple and may be arranged in an array and respectively disposed in the zones A1 and A3, and the contacts C1 and C3 may be respectively located between the support structures (support pillars) 98.

Figure 5C:
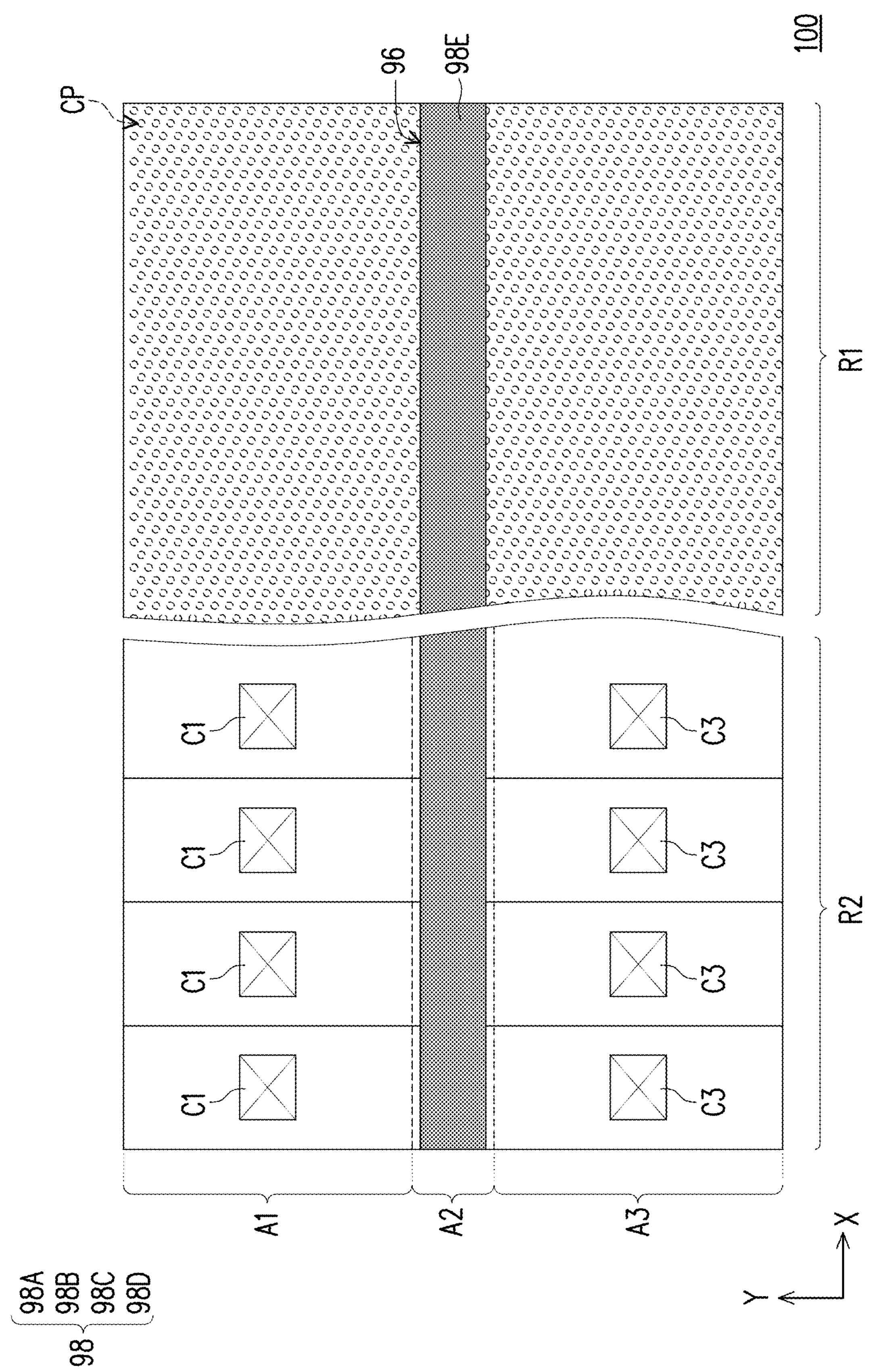
Figure 5D:
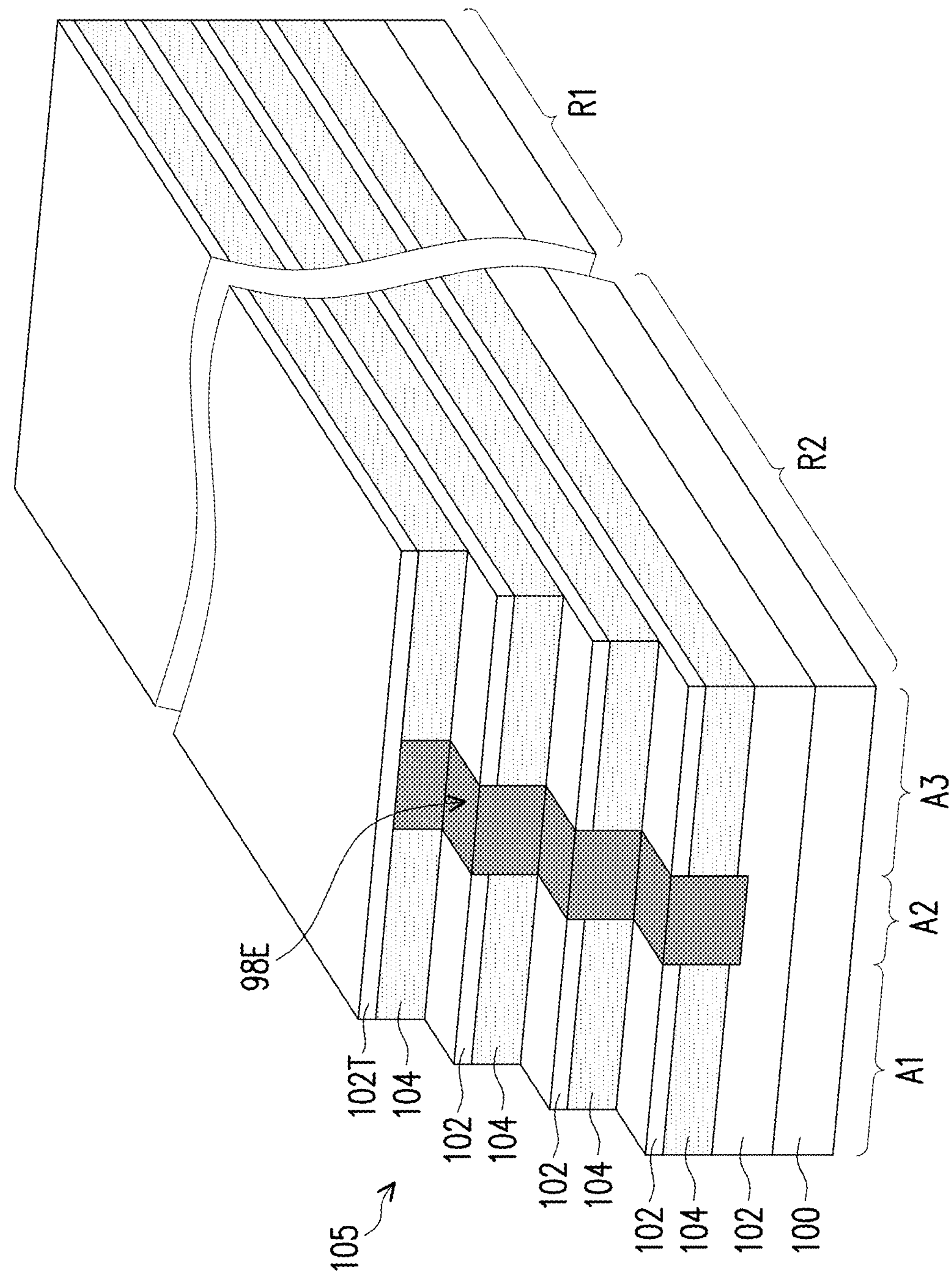
FIG. 5D is a partial perspective view of FIG. 5C.

Referring to FIG. 5C, in other embodiments, the opening 96 may be a trench extending from the zone A2 of the staircase region R2 to the memory array region R1. The support structure 98 formed in the trench may be a support slit continuously extending from the memory array region R1 to the staircase region R2. In FIG. 5C and FIG. 5D, one support structure (slit wall) 98 is shown as an example, but the disclosure is not limited thereto. The support structure (support slit) 98 is disposed in the zone A2 and is located between the contacts C1 and C3.

Figure 1B:
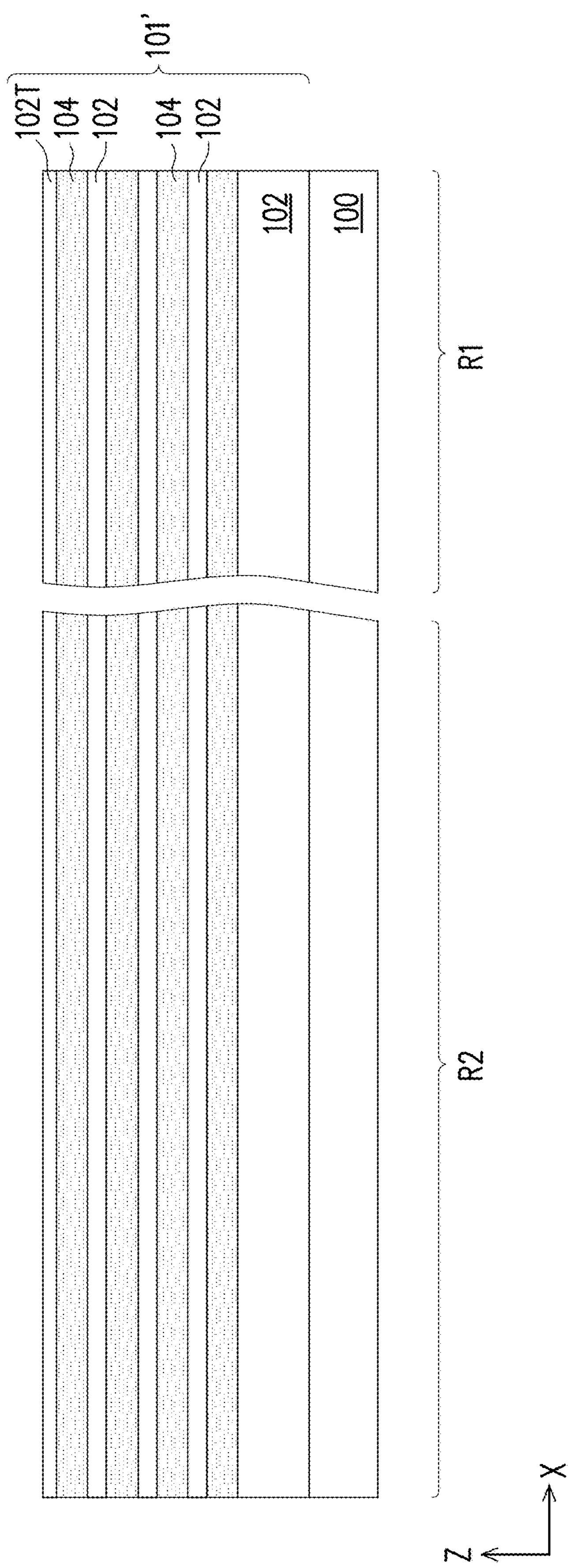
Figure 2B:
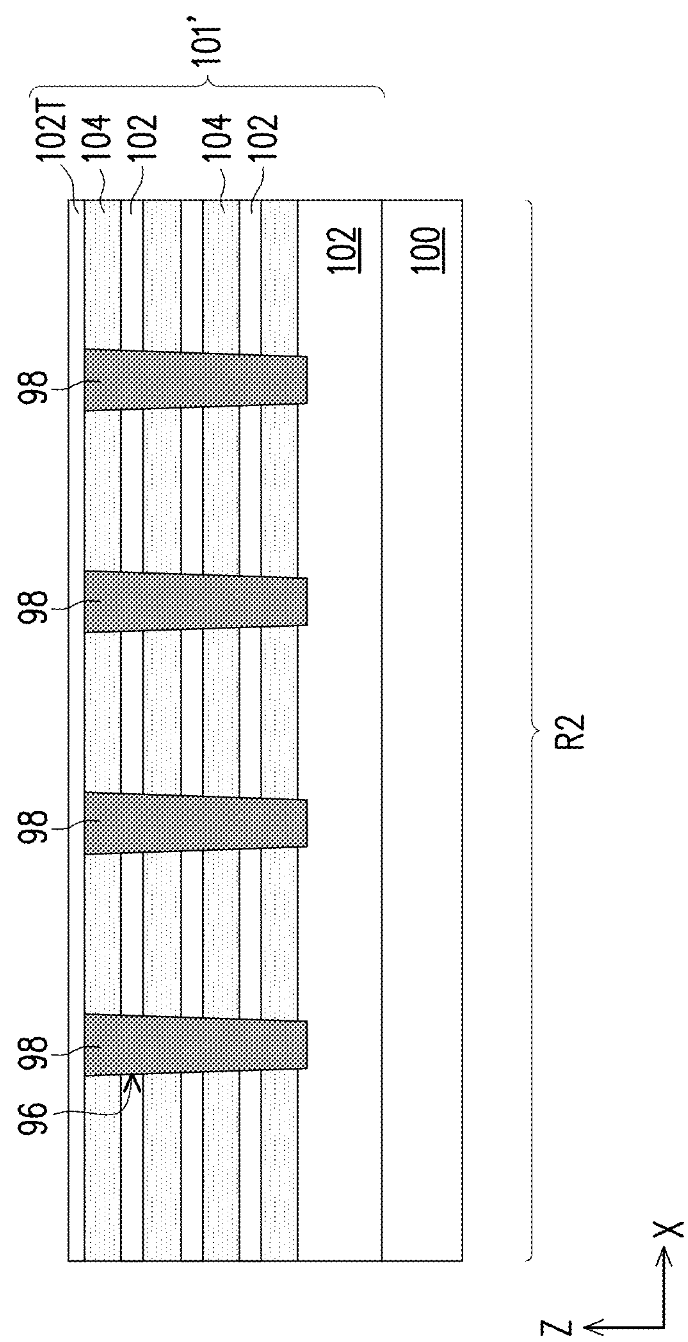

Next, referring to FIG. 1B and FIG. 2B, an insulating layer 102T is formed on the stacked structure 101 in the memory array region R1 and the staircase region R2 and the support structure 98. The material of the insulating layer 102T is different from that of the second material layer 104, and the same as the first material layer102, and may be, for example, silicon oxide. The insulating layer 102T and the stacked structure 101 may be collectively referred to as a stacked structure 101'.

Figure 1C:
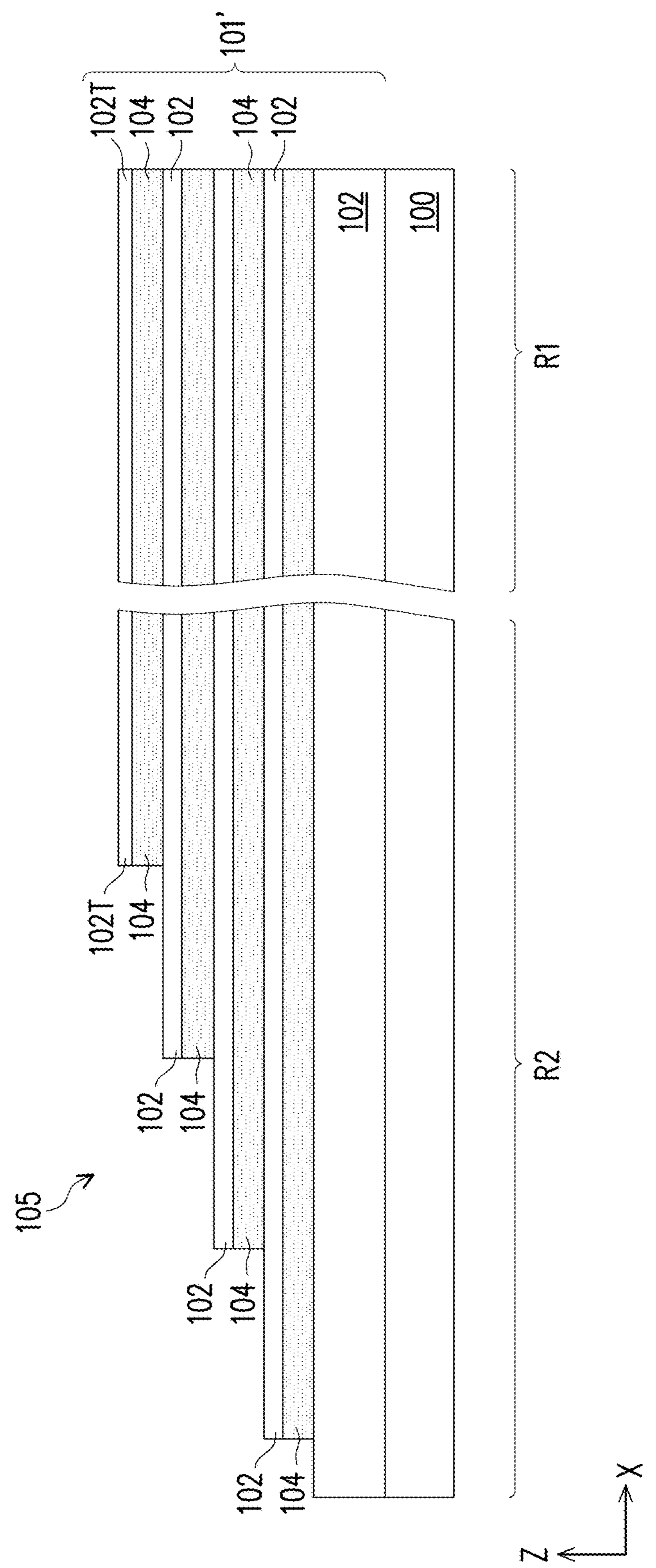
Figure 2C:
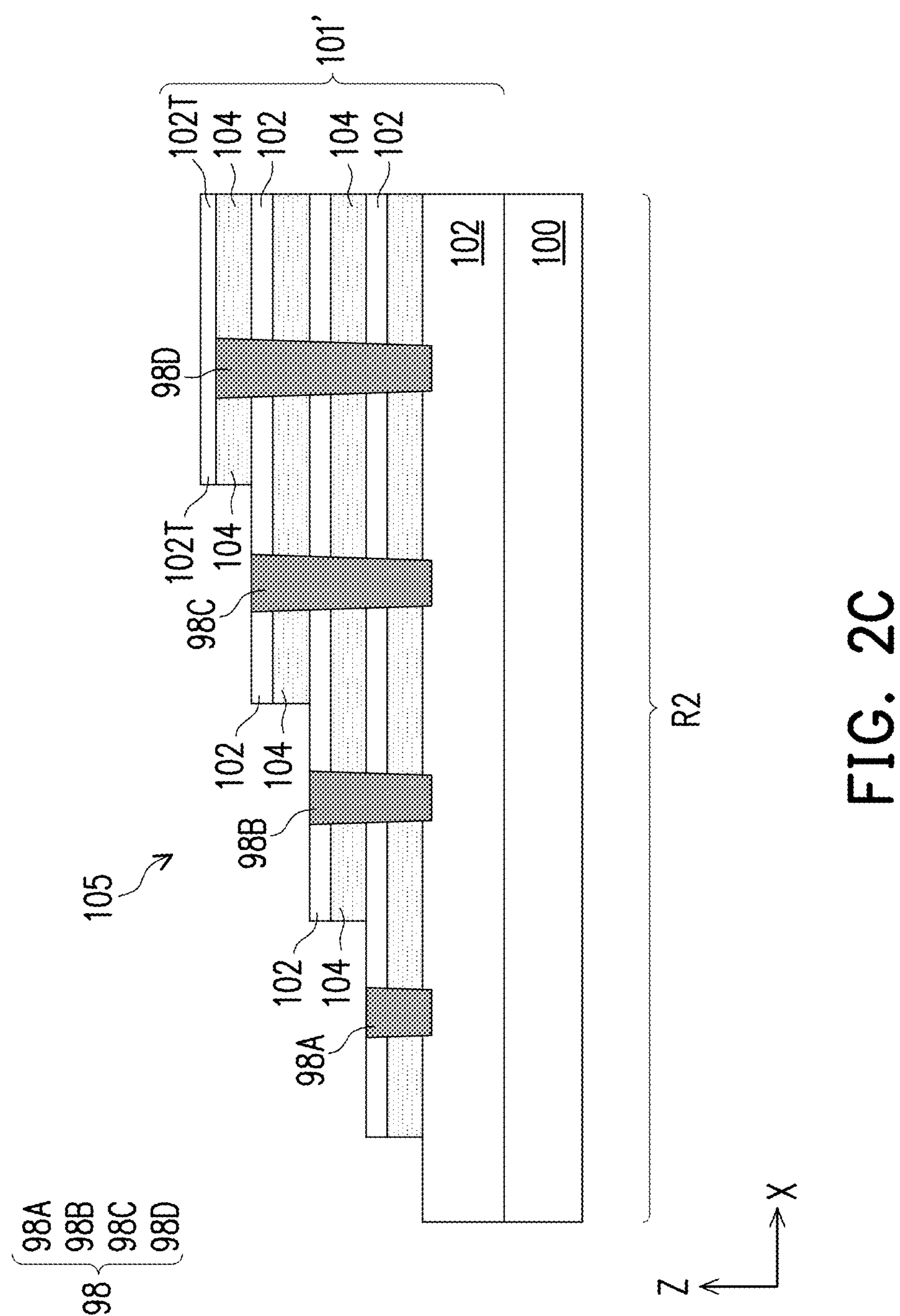

Afterwards, referring to FIG. 1C and FIG. 2C, the insulating layer 102T, the second material layer 104, the first material layer 102, and the support structure 98 of the stacked structure 101' are patterned, so that the ends of the insulating layer 102T, the second material layer 104, and the first material layer 102 form a staircase structure 105 in the staircase region R2. In some embodiments, the support structure 98 is patterned to form support structures (support pillars) 98A, 98B, 98C, and 98D having different heights, as shown FIG. 2C. In other embodiments, the support structure 98 is patterned to form a support structure (support slit) 98E having different heights, as shown in FIG. 5D.

Referring to FIG. 2C, in the staircase region R2, the support structures 98A, 98B, 98C, and 98D penetrate the first material layer 102 and the second material layer 104 in the staircase structure 105 and extend into the lowermost first material layer 102. Except that the top surface of the support pillar 98D, which is closest to the memory array region R1, is covered by the insulating layer 102T, the top surfaces of the other support structures 98A, 98B, and 98C are exposed. In the staircase region R2, in the portion where the support structures 98A, 98B, 98C and 98D are not formed, the second material layer 104 of the staircase structure 105 is covered by the first material layer 102 and the insulating layer 102T, as shown in FIG. 1C and FIG. 2C. In other words, the uppermost layer of the staircase structure 105 exposes the insulating layer 102T and does not expose the support structure 98D. The remaining layers of the staircase structure 105 expose the top surfaces of the first material layers 102 and the top surfaces of the support structures 98A, 98B, and 98C. The top surfaces of the first material layers 102 are respectively coplanar with the support structures 98A, 98B, and 98C, for example. In addition, the sidewall of the staircase structure 105 exposes the insulating layer 102T, the first material layer 102, and the second material layer 104.

Referring to FIG. 5D, the support structure 98 is patterned to form a support structure (support slit) 98E. The support structure (support slit) 98E extends continuously from the memory array region R1 to the staircase region R2. The support structure (support slit) 98E in the memory array region R1 has a same height and is covered by the insulating layer 102T. The support structure (support slit) 98E in the staircase region R2 has different heights. The uppermost level of the staircase structure 105 exposes the insulating layer 102T and does not expose the support structure 98E. The remaining levels of the staircase structure 105 expose the top surfaces of the first material layers 102 and the top surface of the support structure 98E. The top surfaces of the first material layers 102 are coplanar with the support structure 98E, for example. In addition, the sidewall of the staircase structure 105 exposes the insulating layer 102T, the first material layer 102, the second material layer 104, and the support structure 98E. For convenience of description, the support structure 98 will continue to be referred to in the following paragraphs to describe the subsequent fabrication processes. The support structure 98 may be the support structures 98A, 98B, 98C, and 98D or the support structure 98E.

Figure 1D:
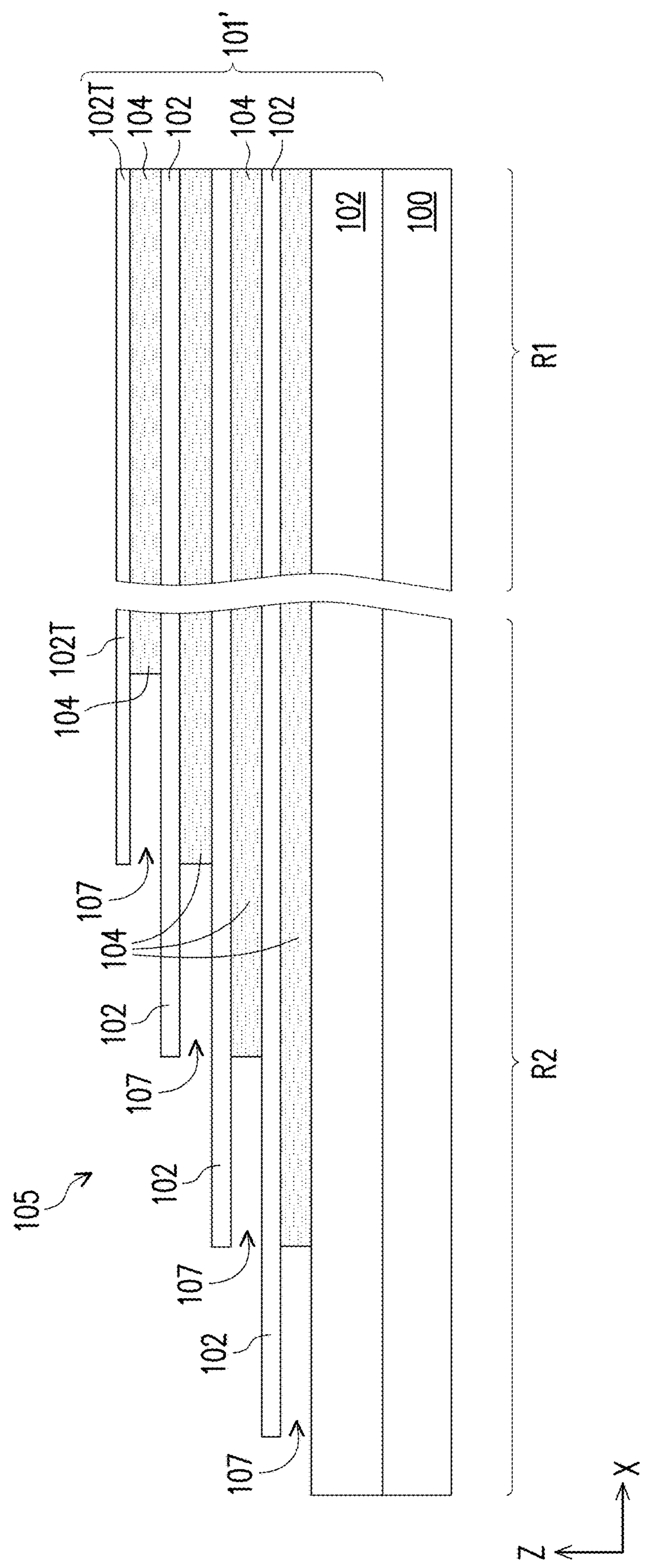
Figure 2D:
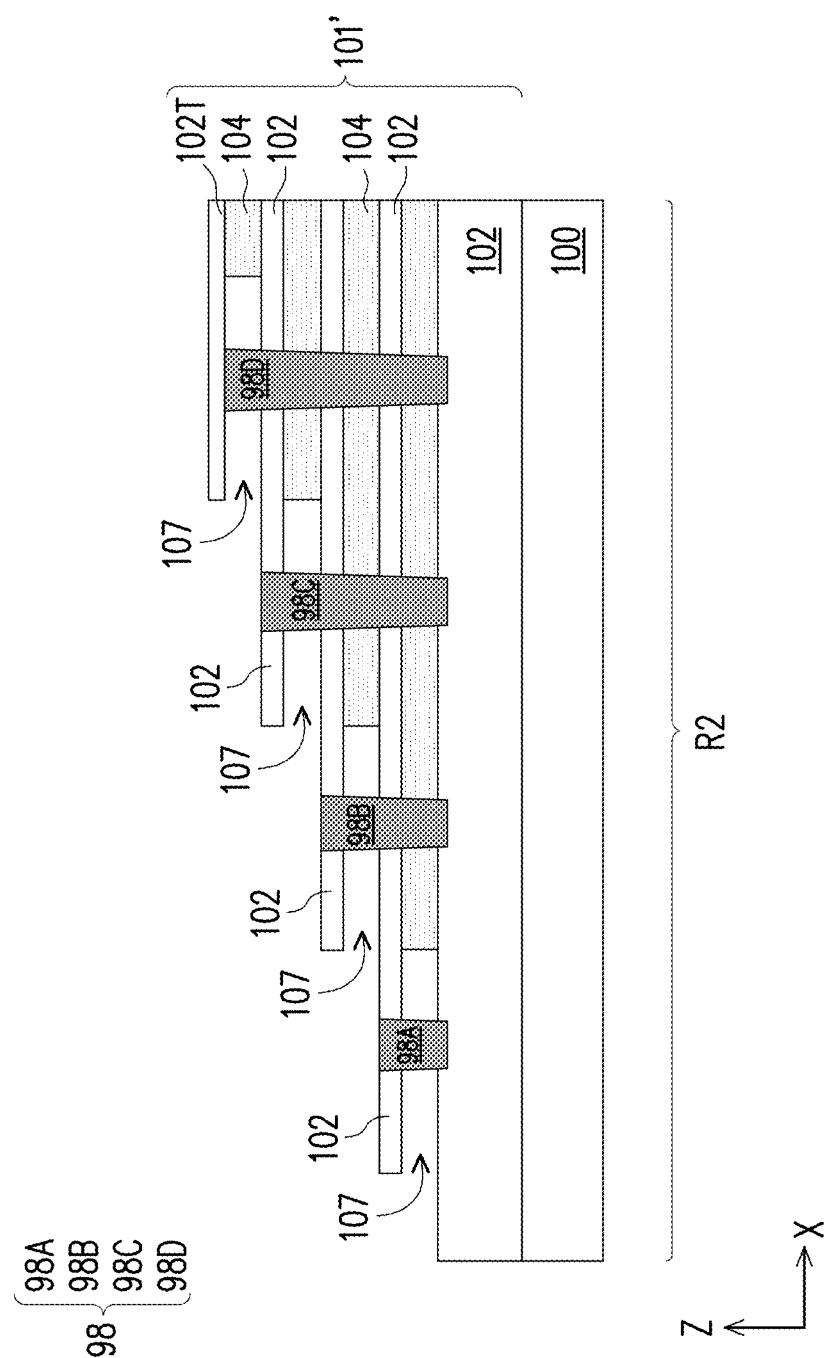

Referring to FIG. 1D and FIG. 2D, a pull-back process, such as a selective etching process, is performed to remove the end part of the second material layer 104 of the staircase structure 105 to form a plurality of horizontal openings 107. In some embodiments, the pull-back process may be performed on the end parts of all the second material layers 104, as shown in FIG. 1D and FIG. 2D. The pull-back process may also be performed on the end part of one or multiple second material layers 104 (not shown). For example, a mask layer may be used to cover the lower one to two second material layers 104 of the stacked structure 101', so that the pull-back process is only performed on the upper one to two second material layers 104 of the stacked structure 101' and the horizontal opening 107 is formed at the end of the upper one to two second material layers 104 of the stacked structure 101'.

The pull-back process is, for example, a selective etching process. The selective etching process may be a dry or wet etching process. In some embodiments, the second material layer 104 is silicon nitride, and the wet etching process uses hot phosphoric acid as the etchant. In some embodiments, the second material layer 104 is doped polysilicon, and the wet etching process uses ammonia water as the etchant. The support structure 98 may support the insulating layer 102T and the first material layer 102 to prevent collapse of the staircase structure 105 in the selective etching process. The thickness of the first material layer 102 between two adjacent horizontal openings 107 is, for example, 20 nm or more.

Figure 1E:
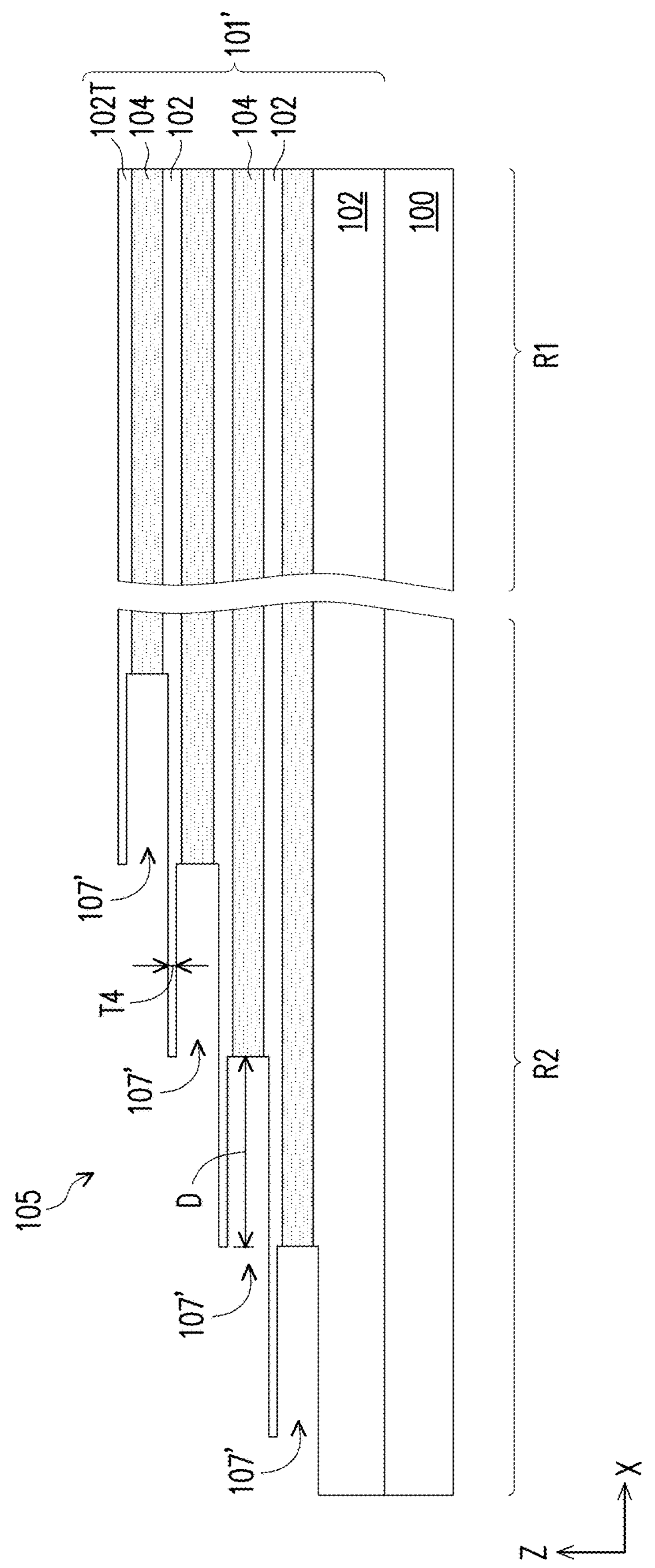
Figure 2E:
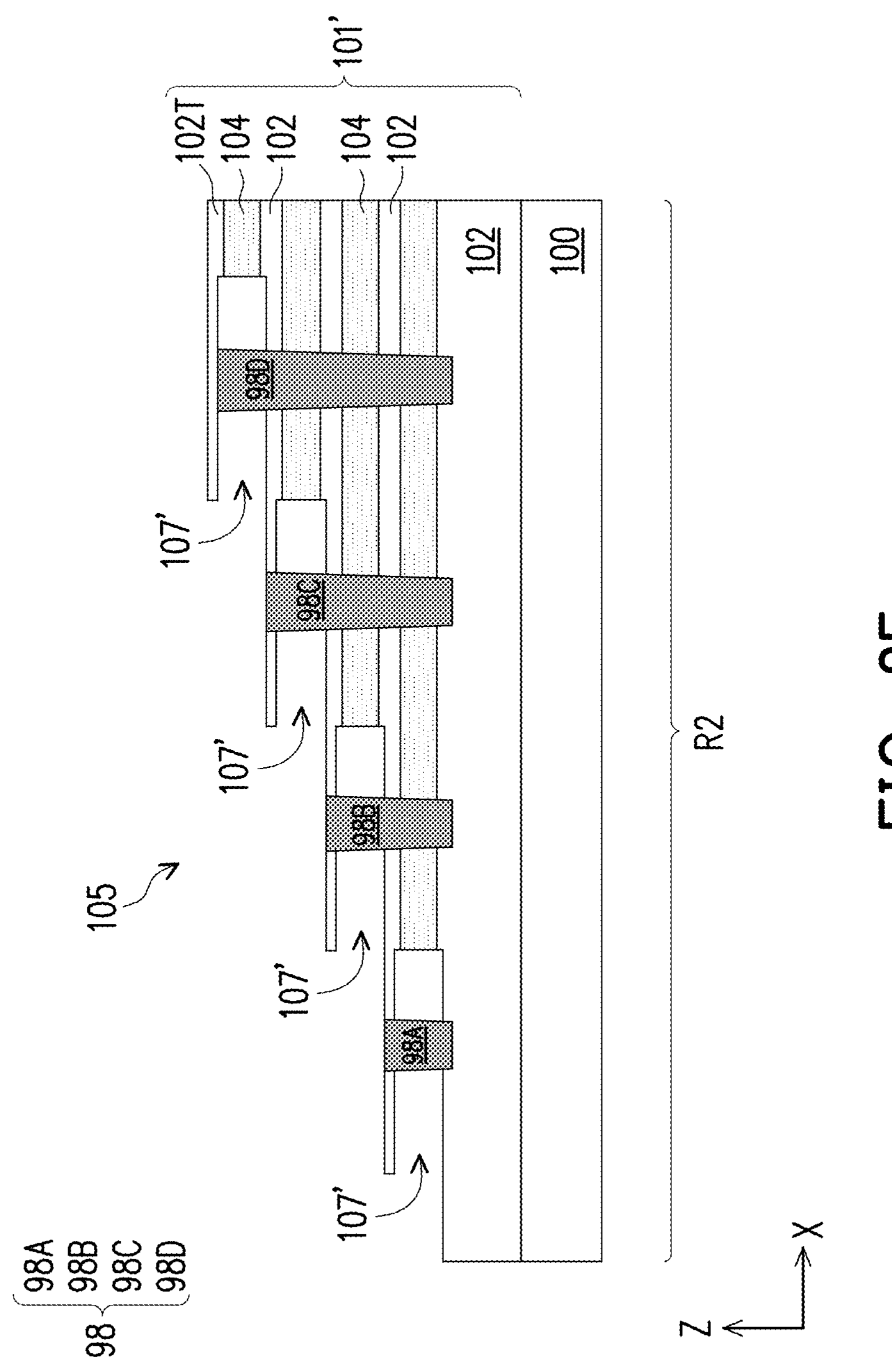

Referring to FIG. 1E and FIG. 2E, an expansion process, such as a selective etching process, is performed to remove the first material layer 102 and the insulating layer 102T exposed by the plurality of horizontal openings 107, so that the height of the plurality of horizontal openings 107 is increased to form a plurality of horizontal openings 107'. The selective etching process is, for example, a dry or wet etching process. The selective etching process may use, for example, hydrofluoric acid as an etchant. The first material layer 102 between two adjacent horizontal openings 107' has a sufficient thickness to prevent collapse resulting from an overly small thickness. For preventing the first material layer 102 and the insulating layer 102T collapse, the proportion of the thickness T4 of the first material layer 102 which has performed horizontal openings 107 expansion process to the pull-back amount (i.e., a width D) of the second material layer 104 should be less than or equal to 1:10. For example, if the thickness of remaining first material layer 104 is 10 nm, then the pull-back amount of the second material layer 102 should be less than or equal to 100 nm.

If the supporting structure 98 is applied, the proportion of the thickness T4 of the first material layer 102 which has performed horizontal openings 107 expansion process to the pull-back amount (i.e., the width D) of the second material layer 104 can be more than or equal to 1:40.

Figure 1F:
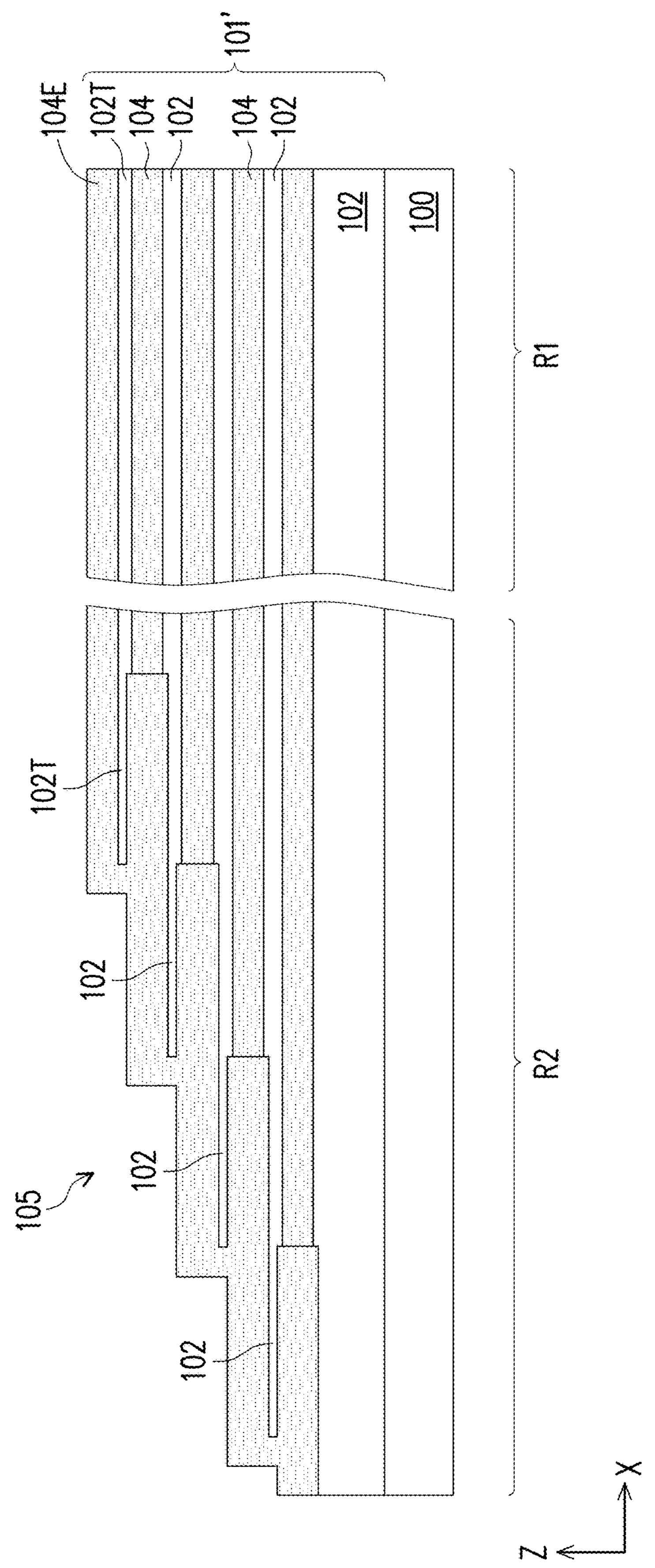
Figure 2F:
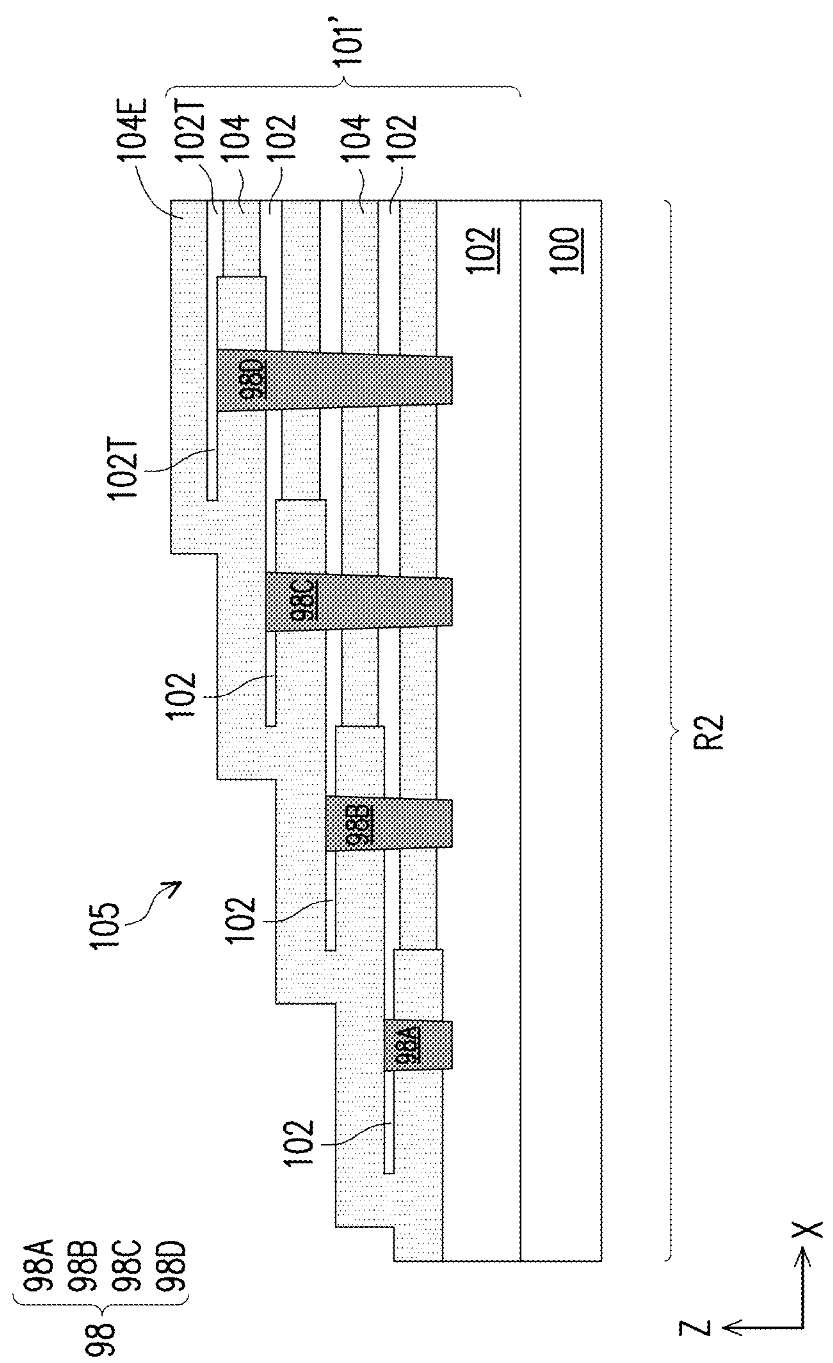

Referring to FIG. 1F and FIG. 2F, a filling layer 104E is formed on the insulating layer 102T and in the plurality of horizontal openings 107'. The filling layer 104E may include the same material as the second material layer 104. The filling layer 104E is, for example, a conformal layer and may conformally cover the insulating layer 102T and fill in the plurality of horizontal openings 107'. The filling layer 104E has excellent gap-filling characteristics and may fill in the plurality of horizontal openings 107'. In some embodiments, seams may be present in the filling layers 104E, and the seams may form multiple voids as the filling layer 104E aggregates in the subsequent thermal process.

Referring to FIG. 1F and FIG. 2F, the filling layer 104E is, for example, silicon nitride, doped polysilicon, or doped amorphous silicon. The doped amorphous silicon will be will be crystallized in a subsequent thermal process. In the embodiment in which the filling layer 104E and the second material layer 104 are doped polysilicon, the dopant in the doped polysilicon or the doped amorphous silicon in the filling layer 104E is of the same type as, or is even the same as, the dopant in the doped polysilicon in the second material layer 104. For example, the filling layer 104E and the second material layer 104 may both be polysilicon doped with phosphorus.

Figure 1G:
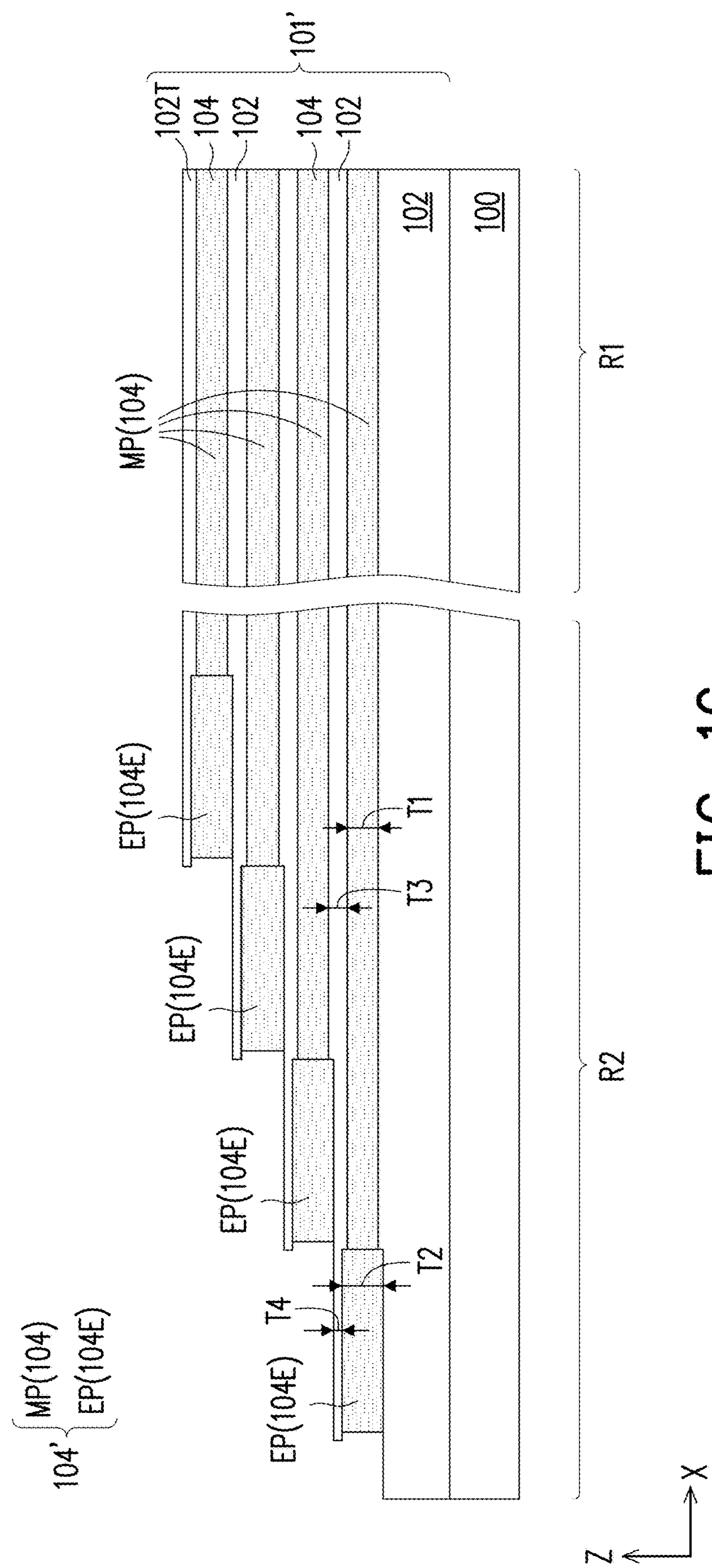
Figure 2G:
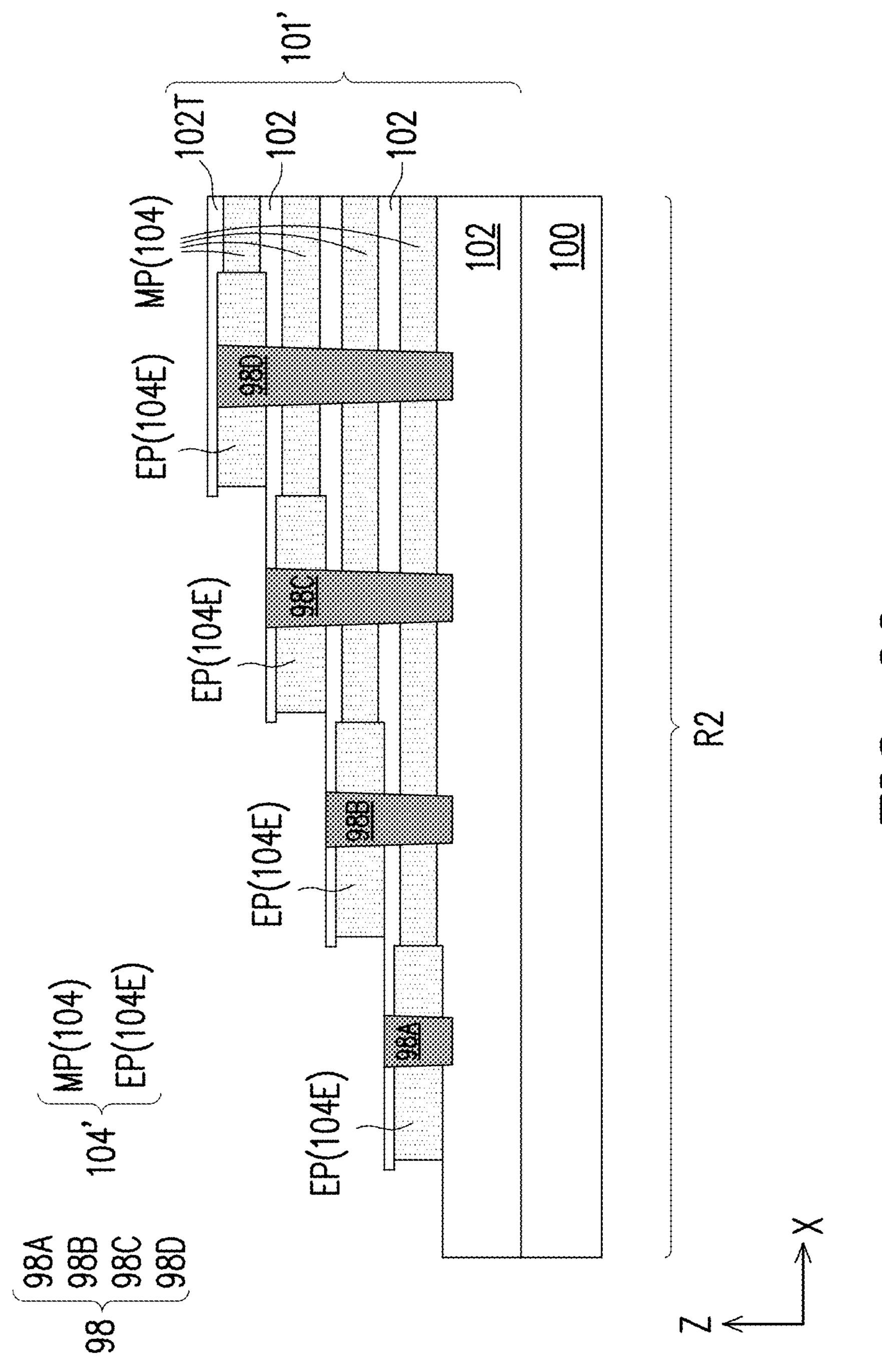

Referring to FIG. 1G and FIG. 2G, the filling layer 104E outside the plurality of horizontal openings 107' is removed, so that the top surfaces of the first material layer 102 and the insulating layer 102T are exposed, and the remaining plurality of filling layers 104E are separated from each other. In some embodiments, the filling layer 104E is formed at the end of each second material layer 104. In other embodiments, the filling layer 104E is formed at the ends of the upper second material layers 104.

The sidewalls of the plurality of filling layers 104E are connected to the sidewalls of the second material layers 104 to form continuous material layers 104'. The filling layer 104E is an end part EP of the material layer 104', and the second material layer 104 is a main body MP of the material layer 104'. A thickness T2 of the end part EP is greater than a thickness T1 of the main body MP. Conversely, a thickness T4 of the first material layer 102 covering the end part EP is less than a thickness T3 of the first material layer 102 covering the main body MP. In addition, in some embodiments, in the longitudinal direction (e.g., the Z direction), one end part EP and another end part EP adjacent thereto may be staggered with each other (as shown in FIG. 1G). In other embodiments, in the longitudinal direction (e.g., the Z direction), one end part EP and another end part EP adjacent thereto may slightly overlap with each other (not shown).

Figure 1H:
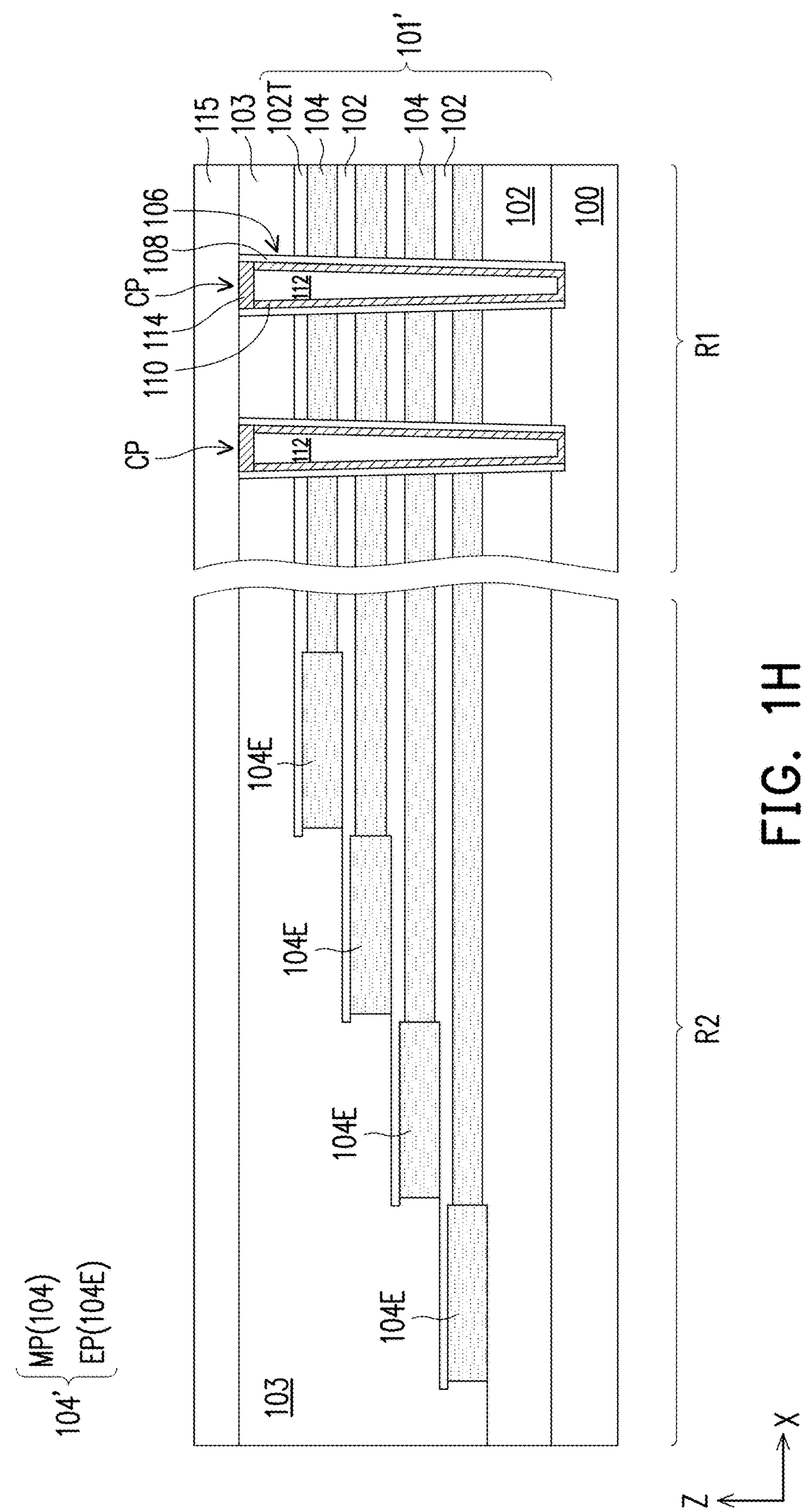
Figure 2H:
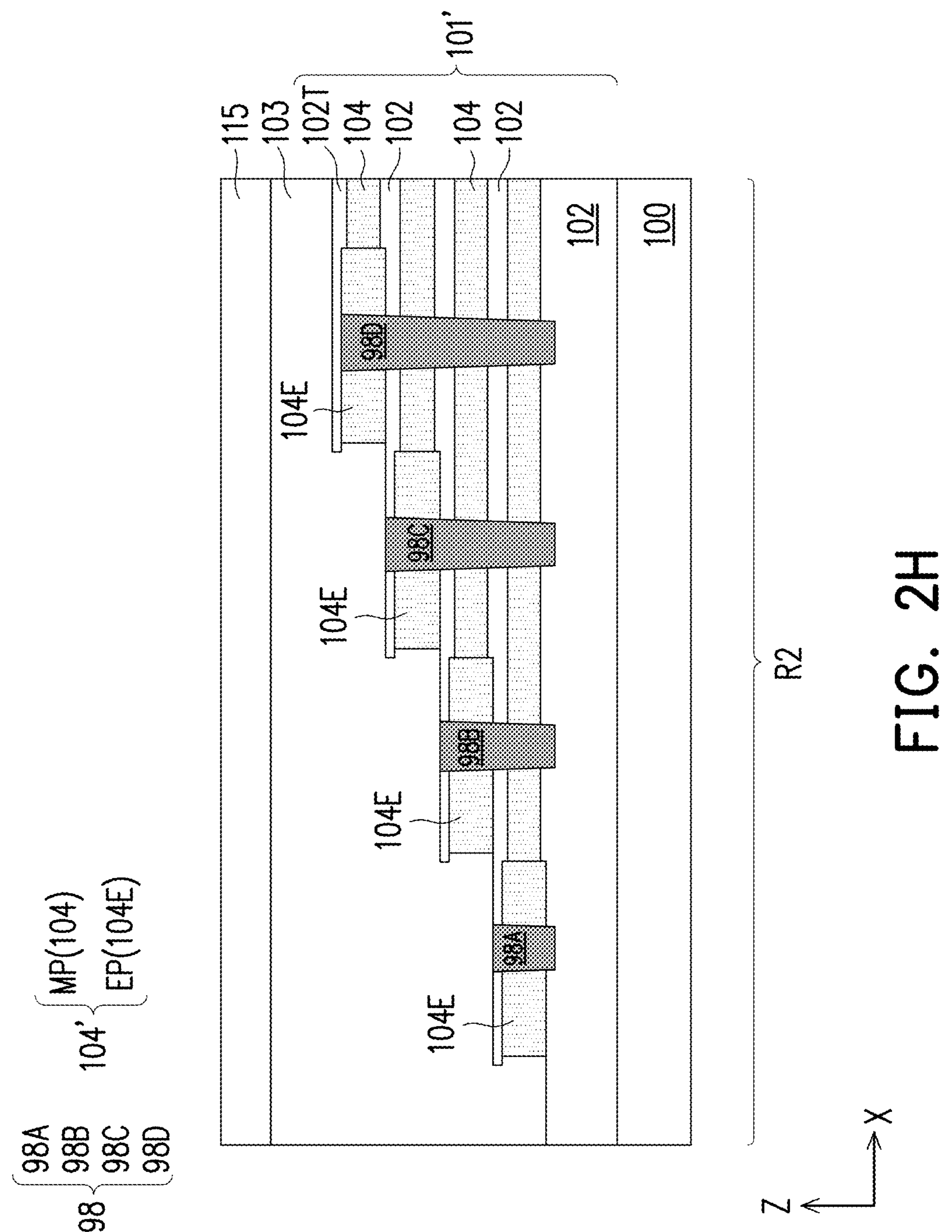

Next, referring to FIG. 1H and FIG. 2H, a dielectric layer 103 is formed on the substrate 100 to cover the stacked structure 101'. Afterwards, as shown in FIG. 1H, a patterning process is performed to remove part of the stacked structure 101' in the memory array region R1 to form one or more openings 106 passing through the stacked structure 101'. In an embodiment, the opening 106 may have a slightly inclined sidewall, as shown in FIG. 1H. In another embodiment, the opening 106 may have a substantially vertical sidewall (not shown). In an embodiment, the opening 106 is also referred to as a vertical channel (VC) hole. Then, a vertical channel pillar CP is formed in the opening 106. The vertical channel pillar CP may be formed as described below but is not limited thereto.

Referring to FIG. 1H, a charge storage structure 108 is formed on the sidewall of the opening 106. The charge storage structure 108 is in contact with the first material layers 102 and the second material layers 104. In an embodiment, the charge storage structure 108 is an oxide/nitride/oxide (ONO) composite layer. In an embodiment, the charge storage structure 108 is formed on the sidewall of the opening 106 in the form of a spacer and exposes the bottom surface of the opening 106.

Then, referring to FIG. 1H, a channel layer 110 is formed on the charge storage structure 108. In an embodiment, the material of the channel layer 110 includes doped polysilicon. In an embodiment, the channel layer 110 covers the charge storage structure 108 on the sidewall of the opening 106 and covers the bottom surface of the opening 106. Next, an insulating pillar 112 is formed in the lower portion of the opening 106. In an embodiment, the material of the insulating pillar 112 includes silicon oxide, for example. Afterwards, a conductive plug 114 is formed in the upper portion of the opening 106, and the conductive plug 114 is in contact with the channel layer 110. In an embodiment, the material of the conductive plug 114 includes polysilicon, for example. The channel layer 110 and the conductive plug 114 may be collectively referred to as a vertical channel pillar CP. The charge storage structure 108 surrounds a vertical external surface of the vertical channel pillar CP. Next, an insulating cap layer 115 is formed on the stacked structure 101'. In an embodiment, the material of the insulating cap layer 115 includes silicon oxide, for example.

Figure 1I:
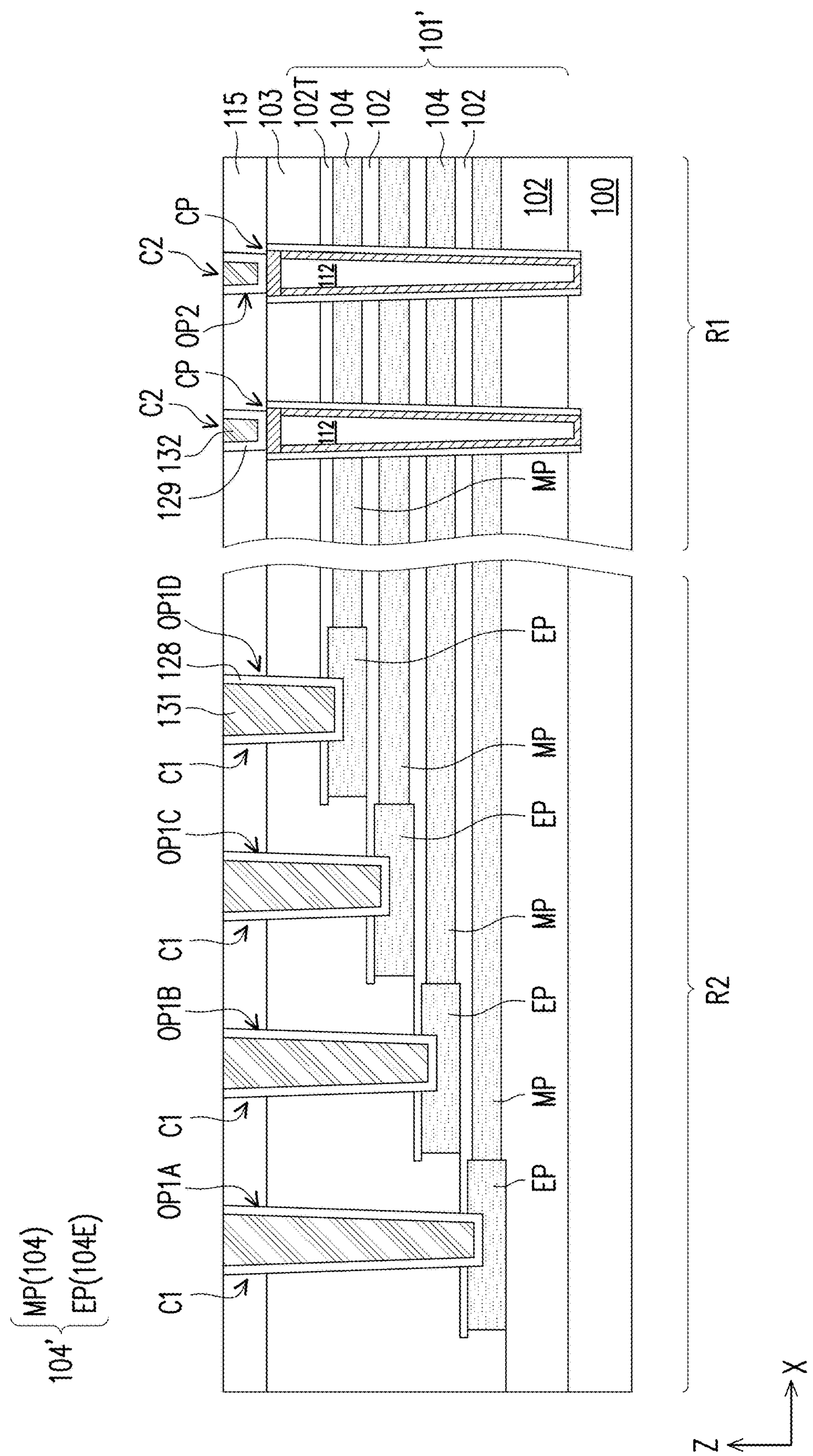
Figure 2I:
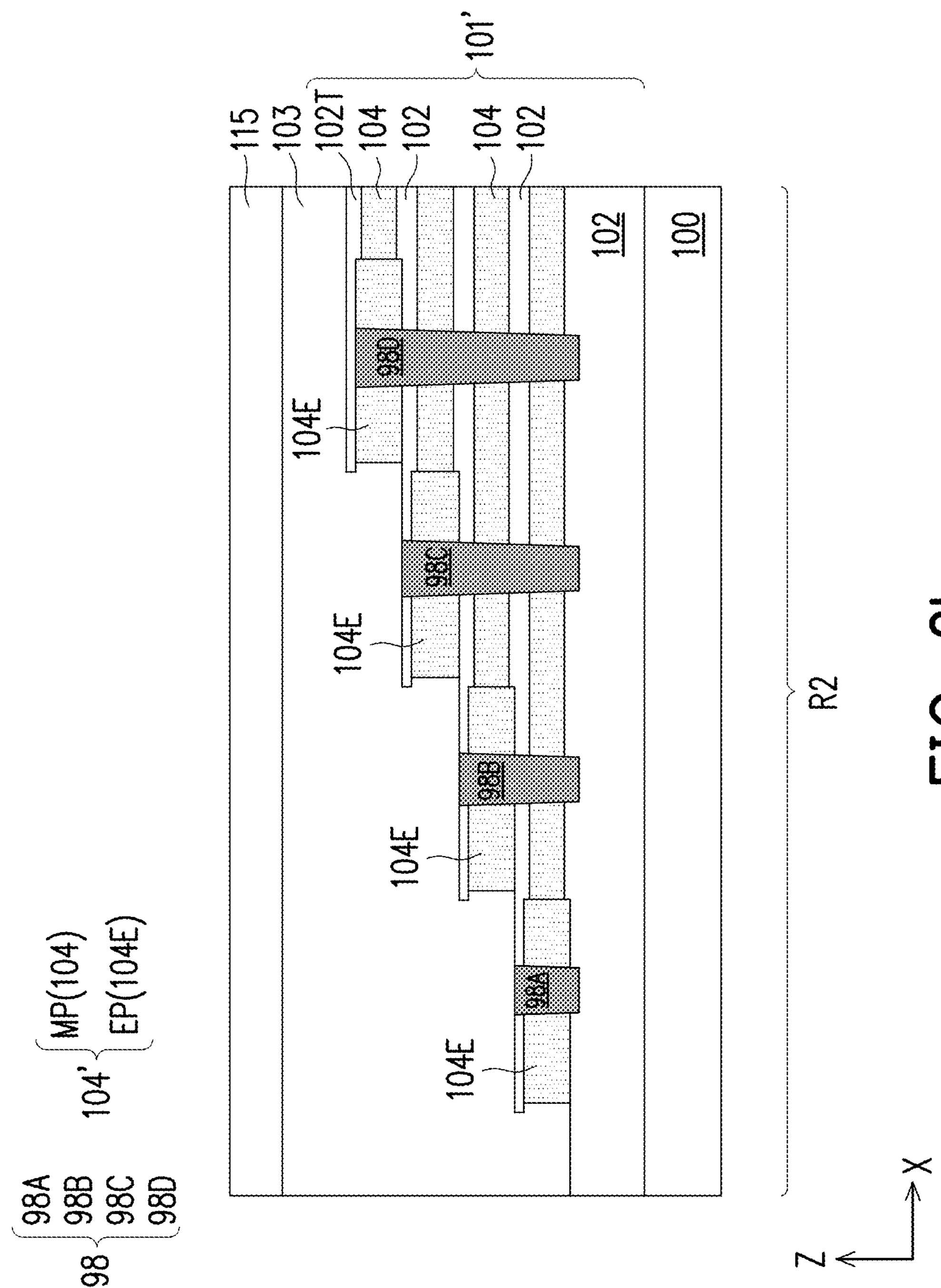

Referring to FIG. 1I and FIG. 2I, in the embodiment in which the second material layer 104 and the filling layer 104E are doped polysilicon, the material layer 104' collectively formed by the second material layer 104 and the filling layer 104E may serve as a gate layer. The material layer 104' (gate layer) surrounds the sidewall of the charge storage structure 108. In the embodiment in which the second material layer 104 and the filling layer 104E are silicon nitride, it is necessary to further perform a gate replacement process so as to form a gate layer 126, which will be described in detail later with reference to FIG. 3A to FIG. 3C and FIG. 4A to FIG. 4C.

Afterwards, referring to FIG. 1I and FIG. 5A, in the embodiment in which the second material layer 104 and the filling layer 104E are doped polysilicon, or in the embodiment in which the second material layer 104 and the filling layer 104E are doped polysilicon and doped amorphous silicon respectively, after the insulating cap layer 115 is formed, a plurality of contacts C1 and C3 are respectively formed in the zone A1 and the zone A3 of the staircase region R2 (as shown in FIG. 1I and FIG. 5A), and a plurality of contacts C2 are formed in the memory array region R1 (as shown in FIG. 1I). The contacts C1 and C3 penetrate the insulating cap layer 115, the dielectric layer 103, the insulating layer 102T, and the first material layer 102, and land on the end part EP of the material layer 104' (gate layer) to be electrically connected thereto, as shown in FIG. 1I and FIG. 5A. The contact C2 penetrates the insulating cap layer 115 of the stacked structure 101' and is electrically connected to the conductive plug 114, as shown in FIG. 1I.

Referring to FIG. 1I, in an embodiment, each of the contacts C1 includes a barrier layer 128 and a conductive layer 131, each of the contacts C2 includes a barrier layer 129 and a conductive layer 132, and each of the contacts C3 includes a barrier layer and a conductive layer (not shown). In an embodiment, the material of the barrier layers 128 and 129 includes titanium (Ti), titanium nitride (TiN), tantalum (Ta), tantalum nitride (TaN), or a combination thereof, and the material of the conductive layers 131 and 132 includes tungsten (W).

Referring to FIG. 1I and FIG. 5A, 5B or FIG. 5C, the contacts C1, C2 and C3 may be formed simultaneously or separately. The contacts C1, C2, and C3 may be formed by the following method. For example, a lithography and etching process is performed to form a plurality of contact openings OP1 and OP2. The contact openings OP1 may pass through the insulating cap layer 115, the dielectric layer 103, and the insulating layer 102T (or the first material layer 102) in the zone A1 of the staircase region R2. The contact openings OP2 may pass through the insulating cap layer 115 in the memory array region R1. Afterwards, a barrier layer and a conductive layer are formed in the plurality of contact openings OP1 and OP2. The contact C3 in the zone A3 of the staircase region R2 may also be formed simultaneously by the above method.

Referring to FIG. 1I, the contact opening OP1 in the staircase region R2 includes contact openings OP1A, OP1B, OP1C, and OP1D. The contact opening OP1A exposes the lowermost end part EP, and the contact opening OP1D exposes the uppermost end part EP. The contact opening OP1A which is farthest from the memory array region R1 has the greatest depth, and the contact opening OP1D which is closest to the memory array region R1 has the smallest depth. In the etching process, the contact opening OP1D is formed first and exposes the end part EP of the uppermost material layer 104' (gate layer). Subsequently, etching is continued to sequentially form the contact openings OP1C, OP1B, and OP1A. In the process of continuing etching to form the contact openings OP1C, OP1B and OP1A, since the end part EP of the material layer 104' (gate layer) has a sufficient thickness T2, and there is sufficient etching selectivity between the material layer 104' and the dielectric layer 103, even if the end part EP is exposed by the contact opening OP1D, it will not be etched through due to constant exposure to the etchant. Therefore, with the formation of the end part EP, the yield of the fabrication process may be increased.

In the embodiment in which the second material layer 104 and the filling layer 104E are silicon nitride, before the above contacts C1, C2, and C3 are formed, it is necessary to perform a gate replacement process first. Referring to FIG. 3A to FIG. 3C and FIG. 4A to FIG. 4C, the detailed description thereof is as follows.

Figure 3A:
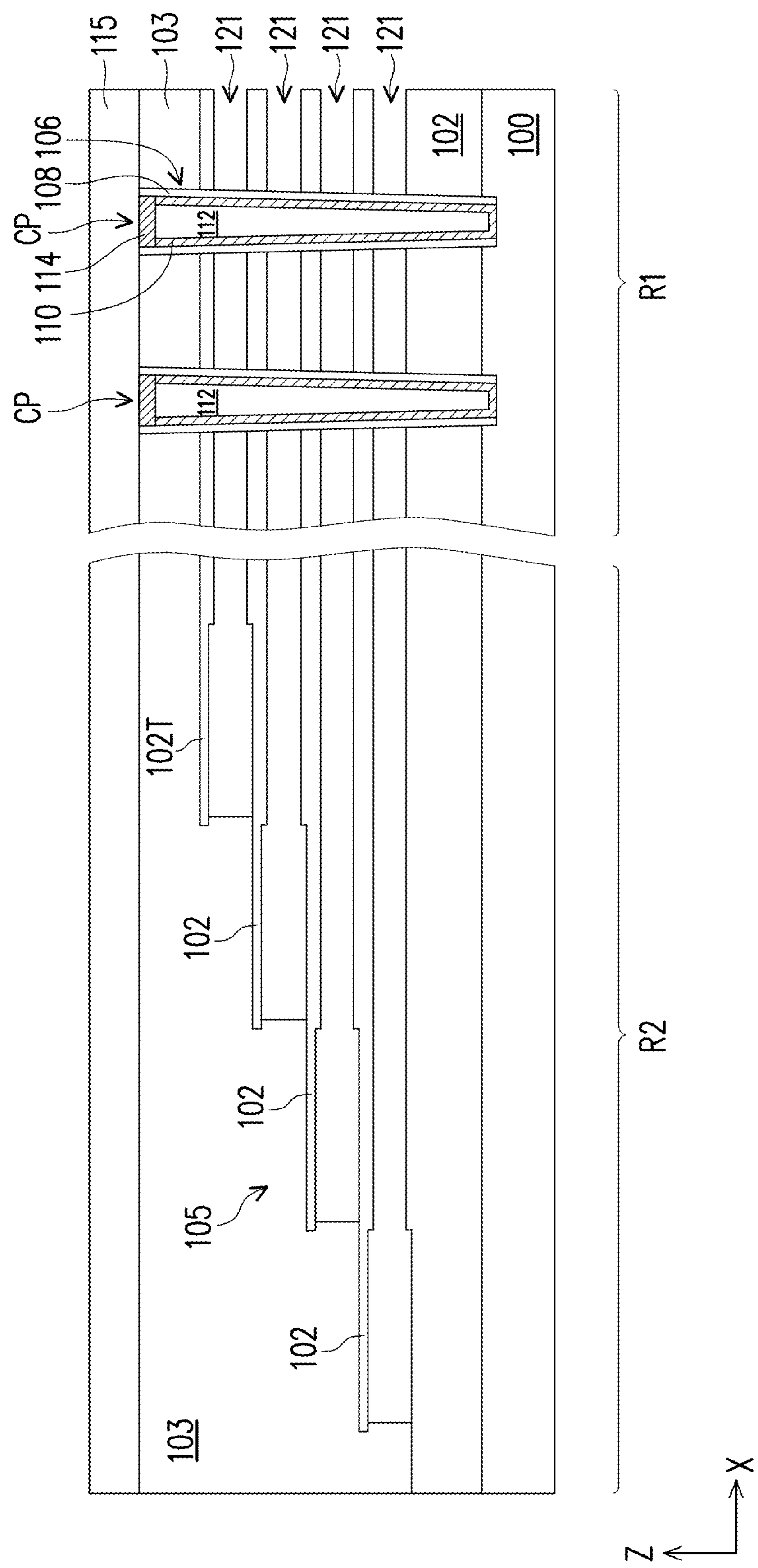
FIG. 3A to FIG. 3C are schematic cross-sectional views of a method of fabricating a three-dimensional memory device according to another embodiment of the disclosure.
Figure 3B:
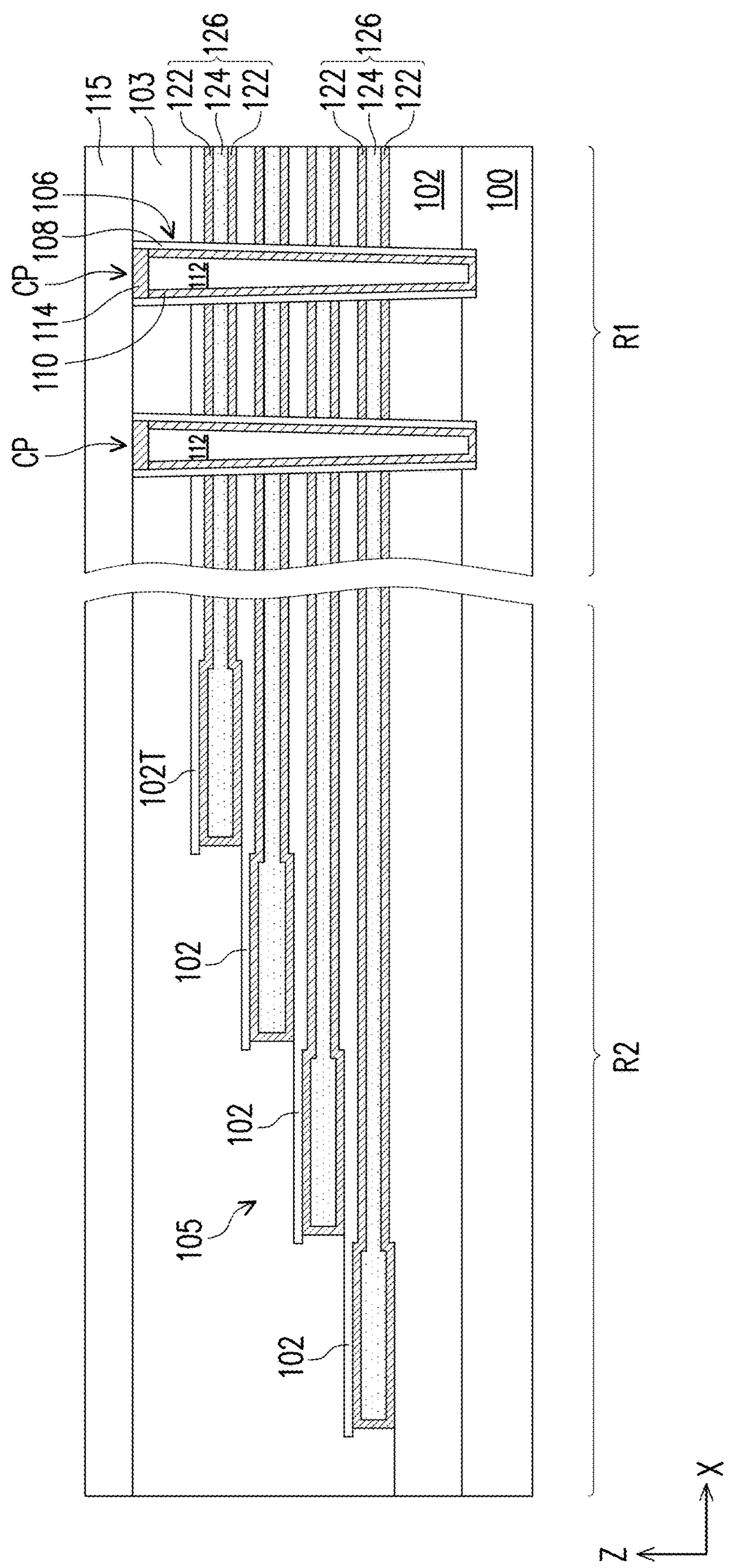
Figure 3C:
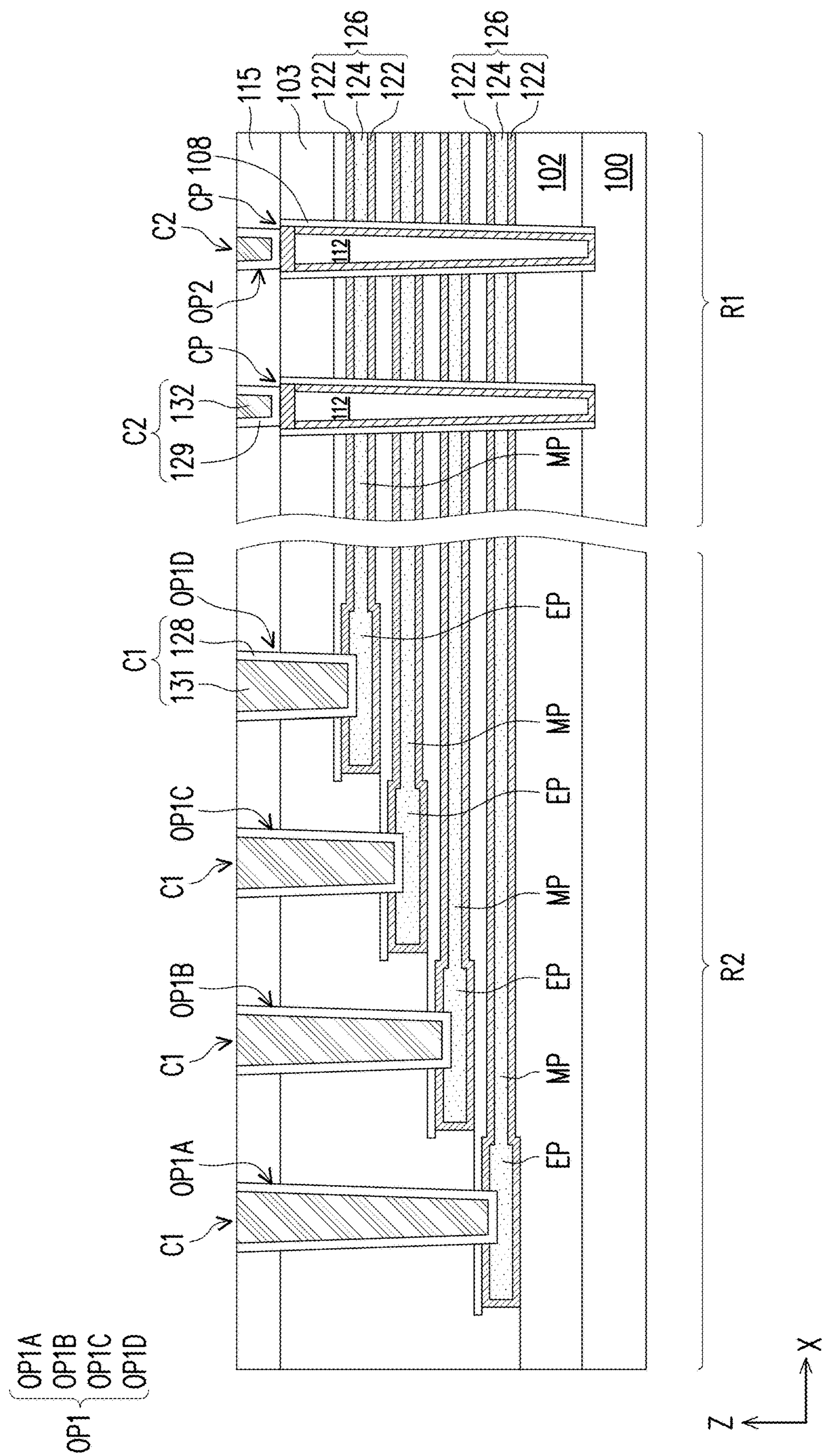
Figure 4A:
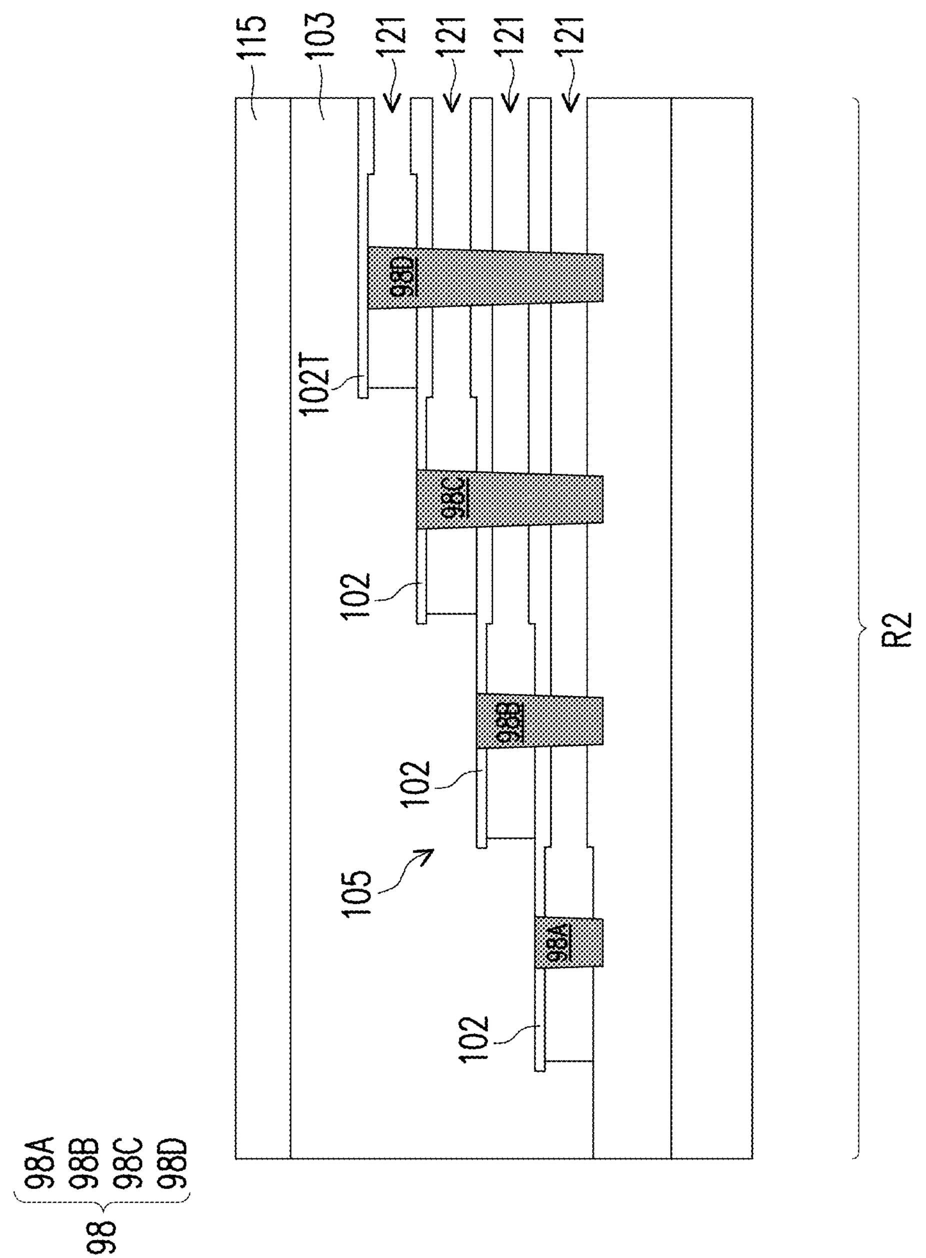
FIG. 4A to FIG. 4C are other schematic cross-sectional views of a method of fabricating a three-dimensional memory device according to another embodiment of the disclosure.
Figure 4B:
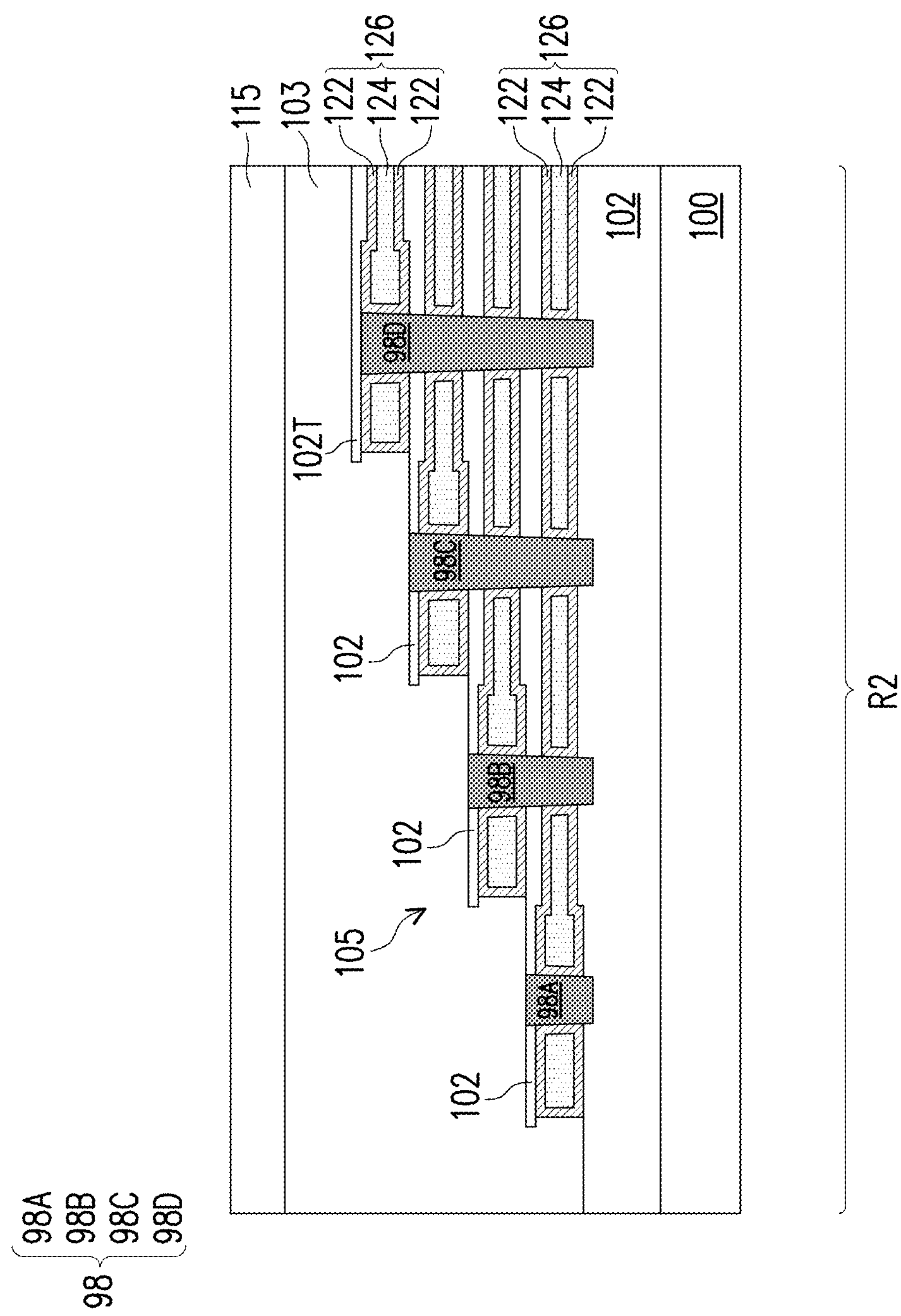
Figure 4C:
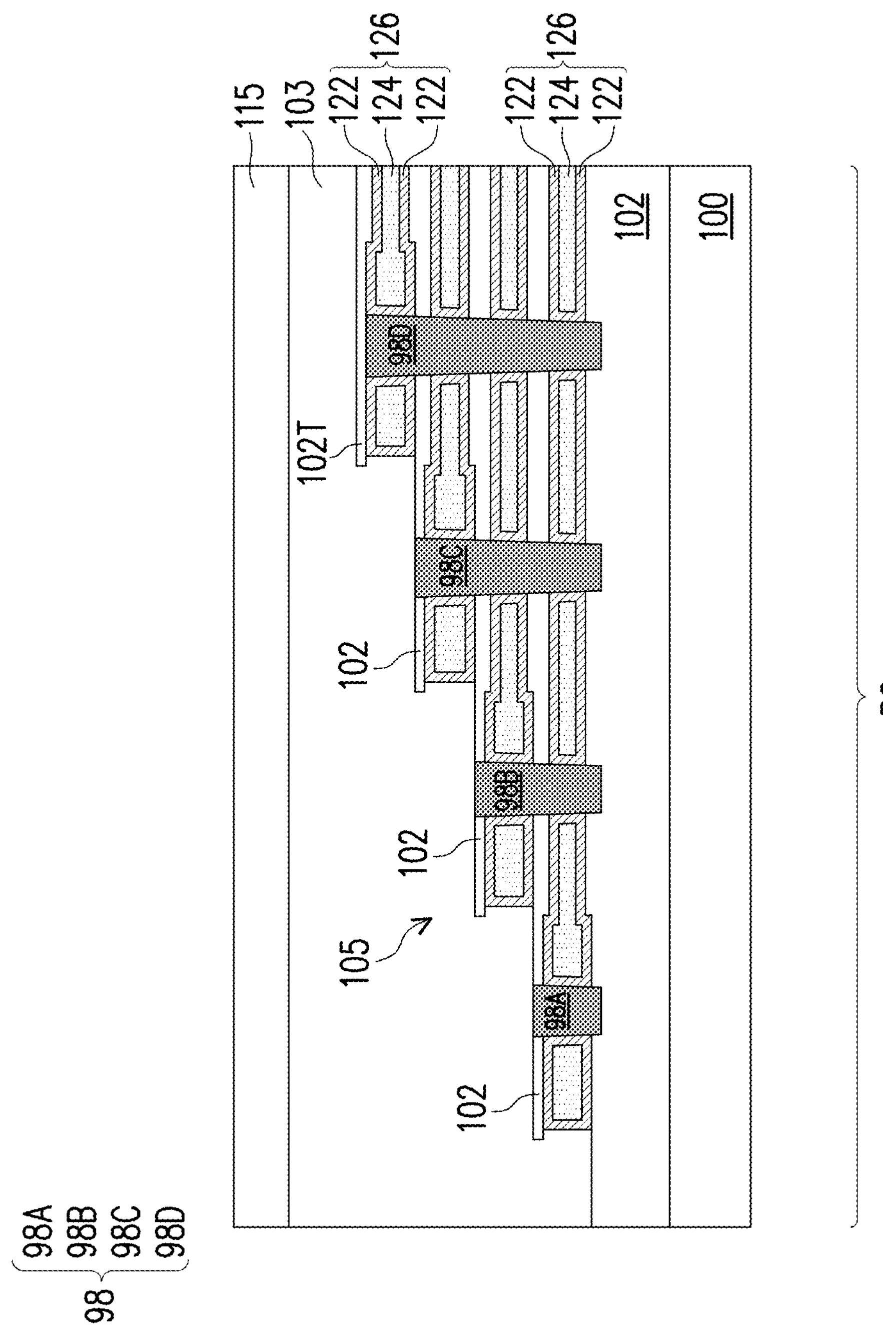

FIG. 3A to FIG. 3C are schematic cross-sectional views of a method of fabricating a three-dimensional memory device according to another embodiment of the disclosure. FIG. 4A to FIG. 4C are other schematic cross-sectional views of a method for fabricating a three-dimensional memory device according to another embodiment of the disclosure. Cross-sectional views of part of the fabrication process along line I-I' of FIG. 5A are as shown in FIG. 3A to FIG. 3C. Cross-sectional views of part of the fabrication process along line II-II' of FIG. 5A are as shown in FIG. 4A to FIG. 4C. Cross-sectional views of part of the fabrication process along line III-III' of FIG. 5B are as shown in FIG. 3A to FIG. 3C. Cross-sectional views of part of the fabrication process along line IV-IV' of FIG. 5B are as shown in FIG. 4A to FIG. 4C.

Referring to FIG. 1H, FIG. 2H, FIG. 3A and FIG. 4A, after the dielectric layer 103 and the insulating cap layer 115 are formed according to the method described above with reference to FIG. 1H and FIG. 2H, a selective etching process is performed to remove the second material layer 104 and the filling layer 104E in the memory array region R1 and the staircase region R2 to form a plurality of horizontal openings 121. The horizontal opening 121 exposes the charge storage structure 108, the first material layer 102, and the insulating layer 102T in the memory array region R1. In the etching process, the support structures 98A, 98B, 98C, and 98D in the staircase region R2 may prevent collapse of the stacked structure 101'. The selective etching process may be isotropic etching, such as a wet etching process. The etchant used in the wet etching process is, for example, hot phosphoric acid. In some embodiments, after the insulating cap layer 115 is formed and before the plurality of horizontal openings 121 are formed, a dummy pillar may be formed in the staircase region R2 first. In some embodiments, a dummy pattern (not shown) may pass through the insulating cap layer 115 and the dielectric layer 103. The dummy pattern may be a dummy pillar or a dummy fence. The dummy pattern may be in contact with the top surface of any one, all, or none of the support pillars 98A, 98B, 98C, and 98D. In other embodiments, the dummy pattern may penetrate the insulating cap layer 115, the dielectric layer 103, and the staircase structure 105 to reach the lowermost first material layer 102 of the staircase structure 105. The material of the dummy pattern is different from the second material layer 104 and may be, for example, silicon oxide. The dummy pattern may support the stacked structure 101' and prevent collapse of the stacked structure 101' in the process of forming the plurality of horizontal openings 121.

Referring to FIG. 3B and FIG. 4B, a conductive layer is formed in the horizontal opening 121. The conductive layer includes, for example, a barrier layer 122 and a metal layer 124. In an embodiment, the material of the barrier layer 122 includes titanium (Ti), titanium nitride (TiN), tantalum (Ta), tantalum nitride (TaN), or a combination thereof, and the material of the metal layer 124 includes tungsten (W). The conductive layer in the horizontal opening 121 serves as the gate layer 126.

Referring to FIG. 3C, FIG. 4C, and FIG. 5A, according to the above method, a plurality of contacts C1 and C3 are respectively formed in the zone A1 and the zone A3 of the staircase region R2, as shown in FIG. 3C and FIG. 5A, and a plurality of contacts C2 are formed in the memory array region R1, as shown in FIG. 3C.

In the above embodiments, the support pillar structures 98, 98A, 98B, 98C, 98D, and/or 98E may be formed in the stacked structure 101 or 101' in the staircase region R2 first before the end part EP is formed to prevent collapse of the stacked structure 101' during the etching process for forming the end part EP. In an alternative embodiment, the pillar structures 98, 98A, 98B, 98C, 98D, and/or 98E may not be formed when collapse of the stacked structure 101' does not occur during the etching process for forming the end EP.

In the embodiments of the disclosure, the thickness of the end part of the second material layer (which is silicon nitride or doped polysilicon, for example) in the staircase region is locally increased, which may prevent the gate layer under the contact opening having a smaller depth from being etched through in the process of forming contact openings having different depths. Therefore, the formation of the end part increases the process window and thus increases the yield of the fabrication process. The end part may be formed by multiple selective etchings and refillings, and this process may be integrated with the existing processes. In addition, the support pillar structure may be formed in the stacked structure in the staircase region first before the end part is formed to prevent collapse of the stacked structure in the etching process for forming the end part.

It will be apparent to those skilled in the art that various modifications and variations may be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A memory device comprising:

a substrate comprising a memory array region and a staircase region;

a stacked structure located on the substrate in the memory array region and the staircase region, wherein the stacked structure comprises a plurality of conductive layers and a plurality of insulating layers stacked alternately on each other, and each of the plurality of conductive layers comprises:

a main body located in the memory array region and extending to the staircase region; and an end part connected to the main body and located in the staircase region, wherein a thickness of the end part is greater than a thickness of the main body;

a dielectric layer located on the stacked structure in the memory array region and the staircase region;

a first contact penetrating the dielectric layer in the staircase region and the corresponding insulating layer located on the end part, and landing on and connected to the end part; and a support structure disposed beside the first contact.

2. The memory device according to claim 1, wherein the support structure comprises:

a support pillar disposed beside the first contact, penetrating the end part from the corresponding insulating layer located on the end part, and extending to the lowermost insulating layer of the stacked structure.

3. The memory device according to claim 1, further comprising:

a second contact disposed beside the first contact, penetrating the dielectric layer in the staircase region and the corresponding insulating layer located on the end part, and landing on and connected to the end part; and wherein the support structure comprises a support slit extending from the memory array region to the staircase region, and disposed between the first contact and the second contact and penetrating the stacked structure.

4. The memory device according to claim 1, further comprising:

a second contact disposed beside the first contact, penetrating the dielectric layer in the staircase region, and landing on and connected to the end part; and wherein the support structure comprises a support pillar disposed between the first contact and the second contact, and penetrating the corresponding insulating layer located on the end part and the end part and extending to the lowermost insulating layer of the stacked structure.

5. The memory device according to claim 1, wherein each of the plurality of conductive layers comprises a doped polysilicon layer.

6. The memory device according to claim 1, wherein each of the plurality of conductive layers comprises a metal layer and a barrier layer surrounding the metal layer.

7. The memory device according to claim 1, wherein a thickness of the corresponding insulating layer located on the end part is less than a thickness of the corresponding insulating layer located on the main body.

8. The memory device according to claim 1, wherein the end part and another end part adjacent thereto are staggered with each other.

9. A method of fabricating a memory device, comprising:

providing a substrate comprising a memory array region and a staircase region;

forming a stacked structure on the substrate in the memory array region and the staircase region, wherein the stacked structure comprises a plurality of first material layers and a plurality of second material layers stacked alternately on each other;

patterning the stacked structure to form a staircase structure in the stacked structure in the staircase region;

removing part of the plurality of second material layers at an end of the staircase structure to form a plurality of first horizontal openings;

removing part of the plurality of first material layers around the plurality of first horizontal openings to increase a height of the plurality of first horizontal openings;

forming an end part in each of the plurality of first horizontal openings, wherein a thickness of the end part is greater than a thickness of the adjacent second material layer;

forming a dielectric layer on the stacked structure in the memory array region and the staircase region; and forming a first contact in the staircase region, wherein the first contact penetrates the dielectric layer in the staircase region and the corresponding first material layer located on the end part, and lands on and is connected to the end part; and forming a support structure beside the first contact.

10. The method of fabricating the memory device according to claim 9, wherein the forming the end part in each of the plurality of first horizontal openings comprises:

forming a third material layer on the stacked structure and in the plurality of first horizontal openings; and removing the third material layer outside the plurality of first horizontal openings to form the end part in each of the plurality of first horizontal openings.

11. The method of fabricating the memory device according to claim 10, wherein the second material layer and the third material layer comprise doped polysilicon, or the second material layer comprises doped polysilicon, and the third material layer comprises doped amorphous silicon.

12. The method of fabricating the memory device according to claim 10, wherein the second material layer and the third material layer comprise silicon nitride.

13. The method of fabricating the memory device according to claim 12, further comprising:

before forming the first contact in the staircase region, removing the second material layer and the end part to form a plurality of second horizontal openings; and forming a plurality of conductive layers in the plurality of second horizontal openings.

14. The method of fabricating the memory device according to claim 9, wherein:

the forming the support structure is performed before forming the staircase structure, and the support structure is formed in the stacked structure in the staircase region.

15. The method of fabricating the memory device according to claim 14, wherein a method of forming the support structure comprises:

forming a hole in the stacked structure in the staircase region to expose the lowermost first material layer of the stacked structure; and forming an insulating layer in the hole to form the support structure.

16. The method of fabricating the memory device according to claim 14, wherein a method of forming the support structure comprises:

forming a trench in the stacked structure in the memory array region and the staircase region to expose the lowermost first material layer of the stacked structure; and forming an insulating layer in the trench to form the support structure.

* * * * *